United States Patent
Gealy et al.

(10) Patent No.: US 9,627,501 B2
(45) Date of Patent: Apr. 18, 2017

(54) GRADED DIELECTRIC STRUCTURES

(71) Applicant: Micron Technology, Inc., Boise, ID (US)

(72) Inventors: F. Daniel Gealy, Kuna, ID (US); Vishwanath Bhat, Boise, ID (US); Cancheepuram V. Srividya, Boise, ID (US); M. Noel Rocklein, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 117 days.

(21) Appl. No.: 14/607,733

(22) Filed: Jan. 28, 2015

(65) Prior Publication Data

US 2015/0137254 A1 May 21, 2015

Related U.S. Application Data (62) Division of application No. 13/366,025, filed on Feb. 3, 2012, now Pat. No. 8,951,903, which is a division
(Continued)

(51) Int. Cl.
| | |
|---|---|
| *H01L 29/51* | (2006.01) |
| *H01L 49/02* | (2006.01) |
| *H01L 29/78* | (2006.01) |
| *C23C 16/455* | (2006.01) |
| *H01L 21/28* | (2006.01) |

(Continued)

(52) U.S. Cl.
CPC ...... *H01L 29/517* (2013.01); *C23C 16/45529* (2013.01); *H01L 21/28194* (2013.01); *H01L 21/3141* (2013.01); *H01L 21/3142* (2013.01); *H01L 21/31641* (2013.01); *H01L 21/31645* (2013.01); *H01L 28/40* (2013.01); *H01L 28/56* (2013.01); *H01L 29/78* (2013.01)

(58) Field of Classification Search
None
See application file for complete search history.

(56) References Cited

U.S. PATENT DOCUMENTS

| | | |
|---|---|---|
| 2,501,563 A | 3/1950 | Colbert et al. |
| 3,812,519 A | 5/1974 | Nakamura et al. |

(Continued)

FOREIGN PATENT DOCUMENTS

EP    0540993 A1    5/1993

OTHER PUBLICATIONS

US 6,827,790, 12/2004, Gealy et al. (withdrawn)
(Continued)

*Primary Examiner* — Joseph Schoenholtz
(74) *Attorney, Agent, or Firm* — Schwegman Lundberg & Woessner, P.A.

(57) ABSTRACT

Graded dielectric layers and methods of fabricating such dielectric layers provide dielectrics in a variety of electronic structures for use in a wide range of electronic devices and systems. In an embodiment, a dielectric layer is graded with respect to a doping profile across the dielectric layer. In an embodiment, a dielectric layer is graded with respect to a crystalline structure profile across the dielectric layer. In an embodiment, a dielectric layer is formed by atomic layer deposition incorporating sequencing techniques to generate a doped dielectric material.

20 Claims, 5 Drawing Sheets

Related U.S. Application Data of application No. 11/216,542, filed on Aug. 30, 2005, now Pat. No. 8,110,469.

(51) Int. Cl.
*H01L 21/314* (2006.01)
*H01L 21/316* (2006.01)

(56) References Cited

U.S. PATENT DOCUMENTS

| | | |
|---|---|---|
| 4,058,430 A | 11/1977 | Suntola et al. |
| 4,111,719 A | 9/1978 | Mader et al. |
| 4,137,103 A | 1/1979 | Mader et al. |
| 4,295,150 A | 10/1981 | Adam |
| 4,332,627 A | 6/1982 | Schmitt et al. |
| 4,491,482 A | 1/1985 | Hori |
| 4,510,584 A | 4/1985 | Dias et al. |
| 4,545,035 A | 10/1985 | Guterman et al. |
| 4,556,975 A | 12/1985 | Smith et al. |
| 4,613,549 A | 9/1986 | Tanaka |
| 4,629,520 A | 12/1986 | Ueno et al. |
| 4,661,282 A | 4/1987 | Clark |
| 4,665,417 A | 5/1987 | Lam |
| 4,672,240 A | 6/1987 | Smith et al. |
| 4,688,078 A | 8/1987 | Hseih |
| 4,746,964 A | 5/1988 | Aronowitz |
| 4,757,360 A | 7/1988 | Faraone |
| 4,769,689 A | 9/1988 | Lin |
| 4,778,772 A | 10/1988 | Takahashi et al. |
| 4,875,085 A | 10/1989 | Ueno et al. |
| 4,939,559 A | 7/1990 | DiMaria et al. |
| 5,016,215 A | 5/1991 | Tigelaar |
| 5,017,977 A | 5/1991 | Richardson |
| 5,049,516 A | 9/1991 | Arima |
| 5,057,448 A | 10/1991 | Kuroda |
| 5,071,782 A | 12/1991 | Mori |
| 5,101,249 A | 3/1992 | Hijiya et al. |
| 5,116,455 A | 5/1992 | Daly |
| 5,153,880 A | 10/1992 | Owen et al. |
| 5,212,101 A | 5/1993 | Canham et al. |
| 5,231,298 A | 7/1993 | Daly |
| 5,245,208 A | 9/1993 | Eimori |
| 5,261,999 A | 11/1993 | Pinker et al. |
| 5,280,185 A | 1/1994 | Aronowitz et al. |
| 5,281,831 A | 1/1994 | Uemoto et al. |
| 5,302,461 A | 4/1994 | Anthony |
| 5,331,188 A | 7/1994 | Acovic et al. |
| 5,332,915 A | 7/1994 | Shimoji et al. |
| 5,345,104 A | 9/1994 | Prall et al. |
| 5,353,431 A | 10/1994 | Doyle et al. |
| 5,389,809 A | 2/1995 | Haken et al. |
| 5,418,389 A | 5/1995 | Watanabe |
| 5,426,603 A | 6/1995 | Nakamura et al. |
| 5,474,947 A | 12/1995 | Chang et al. |
| 5,488,612 A | 1/1996 | Heybruck |
| 5,498,558 A | 3/1996 | Kapoor |
| 5,508,543 A | 4/1996 | Hartstein et al. |
| 5,508,544 A | 4/1996 | Shah |
| 5,561,072 A | 10/1996 | Saito |
| 5,587,609 A | 12/1996 | Murakami et al. |
| 5,600,592 A | 2/1997 | Atsumi et al. |
| 5,608,670 A | 3/1997 | Akaogi et al. |
| 5,618,575 A | 4/1997 | Peter |
| 5,625,233 A | 4/1997 | Cabral, Jr. et al. |
| 5,646,583 A | 7/1997 | Seabury et al. |
| 5,677,867 A | 10/1997 | Hazani |
| 5,691,209 A | 11/1997 | Liberkowski |
| 5,739,544 A | 4/1998 | Yuki et al. |
| 5,765,214 A | 6/1998 | Sywyk |
| 5,789,310 A | 8/1998 | Pramanick et al. |
| 5,798,548 A | 8/1998 | Fujiwara |
| 5,808,943 A | 9/1998 | Sato et al. |
| 5,814,541 A | 9/1998 | Shibata |
| 5,837,597 A | 11/1998 | Saito |
| 5,886,368 A | 3/1999 | Forbes et al. |
| 5,910,880 A | 6/1999 | DeBoer et al. |
| 5,923,056 A | 7/1999 | Lee et al. |
| 5,952,692 A | 9/1999 | Nakazato et al. |
| 5,959,465 A | 9/1999 | Beat |
| 5,973,356 A | 10/1999 | Noble et al. |
| 5,986,932 A | 11/1999 | Ratnakumar et al. |
| 5,991,225 A | 11/1999 | Forbes et al. |
| 6,009,011 A | 12/1999 | Yamauchi |
| 6,020,024 A | 2/2000 | Maiti et al. |
| 6,020,243 A | 2/2000 | Wallace et al. |
| 6,025,228 A | 2/2000 | Ibok et al. |
| 6,040,243 A | 3/2000 | Li et al. |
| 6,069,816 A | 5/2000 | Nishimura |
| 6,077,745 A | 6/2000 | Burns, Jr. et al. |
| 6,087,695 A | 7/2000 | Chen |
| 6,091,626 A | 7/2000 | Madan |
| 6,093,944 A | 7/2000 | VanDover |
| 6,111,285 A | 8/2000 | Al-Shareef et al. |
| 6,115,401 A | 9/2000 | Scobey et al. |
| 6,118,159 A | 9/2000 | Willer et al. |
| 6,133,082 A | 10/2000 | Masuoka |
| 6,141,248 A | 10/2000 | Forbes et al. |
| 6,146,959 A | 11/2000 | DeBoer et al. |
| 6,146,976 A | 11/2000 | Stecher et al. |
| 6,150,723 A | 11/2000 | Harper et al. |
| 6,163,049 A | 12/2000 | Bui |
| 6,169,306 B1 | 1/2001 | Gardner et al. |
| 6,191,443 B1 | 2/2001 | Al-Shareef et al. |
| 6,200,893 B1 | 3/2001 | Sneh |
| 6,203,613 B1 | 3/2001 | Gates et al. |
| 6,210,999 B1 | 4/2001 | Gardner et al. |
| 6,212,103 B1 | 4/2001 | Ahrens et al. |
| 6,229,175 B1 | 5/2001 | Uchida |
| 6,235,599 B1 | 5/2001 | Yu |
| 6,255,683 B1 | 7/2001 | Radens et al. |
| 6,258,695 B1 | 7/2001 | Dunn et al. |
| 6,282,080 B1 | 8/2001 | DeBoer et al. |
| 6,291,364 B1 | 9/2001 | Gealy et al. |
| 6,297,527 B1 | 10/2001 | Agarwal et al. |
| 6,300,203 B1 | 10/2001 | Buynoski et al. |
| 6,306,708 B1 | 10/2001 | Peng |
| 6,316,800 B1 | 11/2001 | Al-Shareef et al. |
| 6,317,364 B1 | 11/2001 | Guterman et al. |
| 6,341,084 B2 | 1/2002 | Numata et al. |
| 6,348,386 B1 | 2/2002 | Gilmer |
| 6,348,709 B1 | 2/2002 | Graettinger et al. |
| 6,368,928 B1 | 4/2002 | Wang et al. |
| 6,368,954 B1 | 4/2002 | Lopatin et al. |
| 6,376,312 B1 | 4/2002 | Yu |
| 6,377,070 B1 | 4/2002 | Forbes |
| 6,395,650 B1 | 5/2002 | Callegari et al. |
| 6,396,745 B1 | 5/2002 | Hong et al. |
| 6,400,552 B2 | 6/2002 | Al-Shareef et al. |
| 6,407,435 B1 | 6/2002 | Ma et al. |
| 6,420,279 B1 | 7/2002 | Ono et al. |
| 6,423,649 B2 | 7/2002 | Gealy et al. |
| 6,433,382 B1 | 8/2002 | Orlowski et al. |
| 6,436,799 B1 | 8/2002 | Ramkumar et al. |
| 6,437,374 B1 | 8/2002 | Northrup et al. |
| 6,440,801 B1 | 8/2002 | Furukawa et al. |
| 6,444,545 B1 | 9/2002 | Sadd et al. |
| 6,445,030 B1 | 9/2002 | Wu et al. |
| 6,448,192 B1 | 9/2002 | Kaushik |
| 6,451,641 B1 | 9/2002 | Halliyal et al. |
| 6,451,662 B1 | 9/2002 | Chudzik et al. |
| 6,455,402 B2 | 9/2002 | Lee et al. |
| 6,458,645 B2 | 10/2002 | DeBoer et al. |
| 6,461,905 B1 | 10/2002 | Wang et al. |
| 6,461,914 B1 | 10/2002 | Roberts et al. |
| 6,475,857 B1 | 11/2002 | Kim et al. |
| 6,476,434 B1 | 11/2002 | Noble et al. |
| 6,482,740 B2 | 11/2002 | Soininen et al. |
| 6,492,241 B1 | 12/2002 | Rhodes et al. |
| 6,504,214 B1 | 1/2003 | Yu et al. |
| 6,504,755 B1 | 1/2003 | Katayama et al. |
| 6,509,280 B2 | 1/2003 | Choi |
| 6,514,842 B1 | 2/2003 | Prall et al. |
| 6,518,121 B2 | 2/2003 | Al-Shareef et al. |
| 6,518,150 B1 | 2/2003 | Matsumoto |

(56) References Cited

U.S. PATENT DOCUMENTS

| | | |
|---|---|---|
| 6,519,176 B1 | 2/2003 | Hamzaoglu et al. |
| 6,521,958 B1 | 2/2003 | Forbes et al. |
| 6,531,354 B2 | 3/2003 | Maria et al. |
| 6,537,613 B1 | 3/2003 | Senzaki et al. |
| 6,541,280 B2 | 4/2003 | Kaushik et al. |
| 6,542,229 B1 | 4/2003 | Kalal et al. |
| 6,544,875 B1 | 4/2003 | Wilk |
| 6,551,893 B1 | 4/2003 | Zheng et al. |
| 6,551,929 B1 | 4/2003 | Kori et al. |
| 6,552,387 B1 | 4/2003 | Eitan |
| 6,559,007 B1 | 5/2003 | Weimer |
| 6,559,014 B1 | 5/2003 | Jeon |
| 6,566,147 B2 | 5/2003 | Basceri et al. |
| 6,566,682 B2 | 5/2003 | Forbes |
| 6,567,312 B1 | 5/2003 | Torii et al. |
| 6,574,143 B2 | 6/2003 | Nakazato |
| 6,576,521 B1 | 6/2003 | Chaudhry et al. |
| 6,580,124 B1 | 6/2003 | Cleeves et al. |
| 6,586,349 B1 | 7/2003 | Jeon et al. |
| 6,586,785 B2 | 7/2003 | Flagan et al. |
| 6,586,797 B2 | 7/2003 | Forbes et al. |
| 6,590,252 B2 | 7/2003 | Kutsunai et al. |
| 6,592,942 B1 | 7/2003 | Van Wijck |
| 6,596,651 B2 | 7/2003 | Gealy et al. |
| 6,602,338 B2 | 8/2003 | Chen et al. |
| 6,617,639 B1 | 9/2003 | Wang et al. |
| 6,620,670 B2 | 9/2003 | Song et al. |
| 6,620,752 B2 | 9/2003 | Messing et al. |
| 6,627,503 B2 | 9/2003 | Ma et al. |
| 6,627,508 B1 | 9/2003 | DeBoer et al. |
| 6,630,383 B1 | 10/2003 | Ibok et al. |
| 6,638,859 B2 | 10/2003 | Sneh et al. |
| 6,652,924 B2 | 11/2003 | Sherman |
| 6,660,660 B2 | 12/2003 | Haukka et al. |
| 6,674,138 B1 | 1/2004 | Halliyal et al. |
| 6,677,640 B1 | 1/2004 | Sandhu et al. |
| 6,682,969 B1 | 1/2004 | Basceri et al. |
| 6,683,011 B2 | 1/2004 | Smith et al. |
| 6,686,212 B1 | 2/2004 | Conley, Jr. et al. |
| 6,689,657 B2 | 2/2004 | Gealy et al. |
| 6,696,332 B2 | 2/2004 | Visokay et al. |
| 6,696,341 B1 | 2/2004 | Sonoda |
| 6,699,745 B1 | 3/2004 | Banerjee et al. |
| 6,706,115 B2 | 3/2004 | Leskela et al. |
| 6,709,989 B2 | 3/2004 | Ramdani et al. |
| 6,710,383 B2 | 3/2004 | Yugami et al. |
| 6,713,846 B1 | 3/2004 | Senzaki |
| 6,727,169 B1 | 4/2004 | Raaijmakers et al. |
| 6,737,309 B2 | 5/2004 | Matsuo |
| 6,740,605 B2 | 5/2004 | Shiraiwa et al. |
| 6,740,928 B2 | 5/2004 | Yoshii et al. |
| 6,744,093 B2 | 6/2004 | Agarwal et al. |
| 6,746,916 B2 | 6/2004 | Agarwal et al. |
| 6,750,066 B1 | 6/2004 | Cheung et al. |
| 6,750,126 B1 | 6/2004 | Visokay et al. |
| 6,754,108 B2 | 6/2004 | Forbes |
| 6,759,081 B2 | 7/2004 | Huganen et al. |
| 6,762,114 B1 | 7/2004 | Chambers |
| 6,767,582 B1 | 7/2004 | Elers |
| 6,770,536 B2 | 8/2004 | Wilk et al. |
| 6,773,981 B1 | 8/2004 | Al-Shareef et al. |
| 6,773,984 B2 | 8/2004 | Srividya et al. |
| 6,777,353 B2 | 8/2004 | Putkonen |
| 6,777,739 B2 | 8/2004 | Agarwal et al. |
| 6,778,441 B2 | 8/2004 | Forbes et al. |
| 6,784,480 B2 | 8/2004 | Bhattacharyya |
| 6,785,120 B1 | 8/2004 | Basceri et al. |
| 6,790,791 B2 | 9/2004 | Ahn et al. |
| 6,794,315 B1 | 9/2004 | Klemperer et al. |
| 6,797,593 B2 | 9/2004 | Chakravarthi et al. |
| 6,800,567 B2 | 10/2004 | Cho |
| 6,803,311 B2 | 10/2004 | Choi |
| 6,806,187 B2 | 10/2004 | Graettinger et al. |
| 6,808,978 B2 | 10/2004 | Kim |
| 6,812,100 B2 | 11/2004 | Ahn et al. |
| 6,812,110 B1 | 11/2004 | Basceri et al. |
| 6,812,157 B1 | 11/2004 | Gadgil |
| 6,821,563 B2 | 11/2004 | Yudovsky |
| 6,821,873 B2 | 11/2004 | Visokay et al. |
| 6,833,285 B1 | 12/2004 | Ahn et al. |
| 6,833,308 B2 | 12/2004 | Ahn et al. |
| 6,835,111 B2 | 12/2004 | Ahn et al. |
| 6,842,370 B2 | 1/2005 | Forbes |
| 6,844,203 B2 | 1/2005 | Ahn et al. |
| 6,844,260 B2 | 1/2005 | Sarigiannis et al. |
| 6,849,908 B2 | 2/2005 | Hirano et al. |
| 6,852,167 B2 | 2/2005 | Ahn |
| 6,853,587 B2 | 2/2005 | Forbes |
| 6,858,120 B2 | 2/2005 | Ahn et al. |
| 6,858,444 B2 | 2/2005 | Ahn et al. |
| 6,858,865 B2 | 2/2005 | Ahn et al. |
| 6,858,894 B2 | 2/2005 | Srividya et al. |
| 6,863,727 B1 | 3/2005 | Elers et al. |
| 6,864,527 B2 | 3/2005 | DeBoer et al. |
| 6,867,097 B1 | 3/2005 | Ramsbey et al. |
| 6,869,877 B2 | 3/2005 | Rhodes et al. |
| 6,884,719 B2 | 4/2005 | Chang et al. |
| 6,884,739 B2 | 4/2005 | Ahn et al. |
| 6,888,188 B2 | 5/2005 | Basceri |
| 6,888,739 B2 | 5/2005 | Forbes |
| 6,893,984 B2 | 5/2005 | Ahn et al. |
| 6,894,944 B2 | 5/2005 | Ishibashi et al. |
| 6,900,122 B2 | 5/2005 | Ahn et al. |
| 6,903,367 B2 | 6/2005 | Forbes |
| 6,914,800 B2 | 7/2005 | Ahn et al. |
| 6,917,112 B2 | 7/2005 | Basceri et al. |
| 6,919,266 B2 | 7/2005 | Ahn et al. |
| 6,921,702 B2 | 7/2005 | Ahn et al. |
| 6,930,059 B2 | 8/2005 | Conley, Jr. et al. |
| 6,930,346 B2 | 8/2005 | Ahn et al. |
| 6,930,360 B2 | 8/2005 | Yamauchi et al. |
| 6,933,225 B2 | 8/2005 | Werkhoven et al. |
| 6,952,032 B2 | 10/2005 | Forbes et al. |
| 6,953,730 B2 | 10/2005 | Ahn et al. |
| 6,955,968 B2 | 10/2005 | Forbes et al. |
| 6,958,302 B2 | 10/2005 | Ahn et al. |
| 6,958,937 B2 | 10/2005 | Forbes et al. |
| 6,960,538 B2 | 11/2005 | Ahn et al. |
| 6,963,103 B2 | 11/2005 | Forbes |
| 6,964,893 B2 | 11/2005 | Matsuo |
| 6,970,053 B2 | 11/2005 | Akram et al. |
| 6,979,855 B2 | 12/2005 | Ahn et al. |
| 6,982,230 B2 | 1/2006 | Cabral, Jr. et al. |
| 6,989,565 B1 | 1/2006 | Aronowitz et al. |
| 6,989,573 B2 | 1/2006 | Ahn et al. |
| 6,995,437 B1 | 2/2006 | Kinoshita et al. |
| 7,012,297 B2 | 3/2006 | Bhattacharyya |
| 7,012,311 B2 | 3/2006 | Ohmi et al. |
| 7,018,868 B1 | 3/2006 | Yang et al. |
| 7,026,694 B2 | 4/2006 | Ahn et al. |
| 7,042,043 B2 | 5/2006 | Forbes et al. |
| 7,045,406 B2 | 5/2006 | Huotari et al. |
| 7,045,430 B2 | 5/2006 | Ahn et al. |
| 7,049,192 B2 | 5/2006 | Ahn et al. |
| 7,064,058 B2 | 6/2006 | Ahn et al. |
| 7,067,439 B2 | 6/2006 | Metzner et al. |
| 7,068,544 B2 | 6/2006 | Forbes et al. |
| 7,071,066 B2 | 7/2006 | Wang et al. |
| 7,074,673 B2 | 7/2006 | Forbes |
| 7,075,829 B2 | 7/2006 | Forbes |
| 7,081,421 B2 | 7/2006 | Ahn et al. |
| 7,084,078 B2 | 8/2006 | Ahn et al. |
| 7,087,954 B2 | 8/2006 | Forbes |
| 7,101,813 B2 | 9/2006 | Ahn et al. |
| 7,112,841 B2 | 9/2006 | Eldridge et al. |
| 7,122,464 B2 | 10/2006 | Vaartstra |
| 7,126,183 B2 | 10/2006 | Forbes et al. |
| 7,129,553 B2 | 10/2006 | Ahn et al. |
| 7,135,369 B2 | 11/2006 | Ahn et al. |
| 7,135,421 B2 | 11/2006 | Ahn et al. |
| 7,135,734 B2 | 11/2006 | Eldridge et al. |
| 7,154,354 B2 | 12/2006 | Akram et al. |
| 7,160,577 B2 | 1/2007 | Ahn et al. |
| 7,160,817 B2 | 1/2007 | Marsh |

(56) References Cited

U.S. PATENT DOCUMENTS

| | | |
|---|---|---|
| 7,166,886 B2 | 1/2007 | Forbes |
| 7,169,673 B2 | 1/2007 | Ahn et al. |
| 7,183,186 B2 | 2/2007 | Ahn et al. |
| 7,187,587 B2 | 3/2007 | Forbes |
| 7,192,824 B2 | 3/2007 | Ahn et al. |
| 7,192,892 B2 | 3/2007 | Ahn et al. |
| 7,195,999 B2 | 3/2007 | Forbes et al. |
| 7,199,023 B2 | 4/2007 | Ahn et al. |
| 7,205,218 B2 | 4/2007 | Ahn et al. |
| 7,211,492 B2 | 5/2007 | Forbes et al. |
| 7,214,994 B2 | 5/2007 | Forbes et al. |
| 7,221,017 B2 | 5/2007 | Forbes et al. |
| 7,221,586 B2 | 5/2007 | Forbes et al. |
| 7,235,501 B2 | 6/2007 | Ahn et al. |
| 7,235,854 B2 | 6/2007 | Ahn et al. |
| 7,250,338 B2 | 7/2007 | Bhattacharyya |
| 7,274,067 B2 | 9/2007 | Forbes |
| 7,279,413 B2 | 10/2007 | Park et al. |
| 7,297,617 B2 | 11/2007 | Farrar et al. |
| 7,301,221 B2 | 11/2007 | Farrar et al. |
| 7,312,494 B2 | 12/2007 | Ahn et al. |
| 7,326,980 B2 | 2/2008 | Ahn et al. |
| 7,365,027 B2 | 4/2008 | Ahn et al. |
| 7,388,246 B2 | 6/2008 | Ahn et al. |
| 7,390,756 B2 | 6/2008 | Ahn et al. |
| 7,402,876 B2 | 7/2008 | Ahn et al. |
| 7,405,454 B2 | 7/2008 | Ahn et al. |
| 7,410,910 B2 | 8/2008 | Ahn et al. |
| 7,410,917 B2 | 8/2008 | Ahn et al. |
| 7,411,237 B2 | 8/2008 | Ahn et al. |
| 7,432,548 B2 | 10/2008 | Forbes et al. |
| 7,498,230 B2 | 3/2009 | Ahn et al. |
| 7,510,983 B2 | 3/2009 | Ahn et al. |
| 7,517,783 B2 | 4/2009 | Ahn et al. |
| 7,531,869 B2 | 5/2009 | Ahn et al. |
| 7,554,161 B2 | 6/2009 | Ahn et al. |
| 7,557,375 B2 | 7/2009 | Richardson et al. |
| 7,560,395 B2 | 7/2009 | Ahn |
| 7,560,793 B2 | 7/2009 | Derderian et al. |
| 7,563,730 B2 | 7/2009 | Forbes et al. |
| 7,572,695 B2 | 8/2009 | Ahn et al. |
| 7,575,978 B2 | 8/2009 | Kraus et al. |
| 7,588,988 B2 | 9/2009 | Ahn et al. |
| 7,589,029 B2 | 9/2009 | Derderian et al. |
| 7,592,251 B2 | 9/2009 | Ahn et al. |
| 7,601,649 B2 | 10/2009 | Ahn et al. |
| 7,602,030 B2 | 10/2009 | Ahn et al. |
| 7,611,959 B2 | 11/2009 | Ahn et al. |
| 7,615,438 B2 | 11/2009 | Ahn et al. |
| 7,625,794 B2 | 12/2009 | Ahn et al. |
| 7,662,729 B2 | 2/2010 | Ahn et al. |
| 7,670,646 B2 | 3/2010 | Ahn et al. |
| 7,687,409 B2 | 3/2010 | Ahn et al. |
| 7,700,989 B2 | 4/2010 | Ahn et al. |
| 7,719,065 B2 | 5/2010 | Ahn et al. |
| 7,727,905 B2 | 6/2010 | Ahn et al. |
| 7,776,762 B2 | 8/2010 | Ahn et al. |
| 7,863,667 B2 | 1/2011 | Ahn et al. |
| 7,915,174 B2 | 3/2011 | Ahn et al. |
| 7,923,381 B2 | 4/2011 | Ahn et al. |
| 7,999,334 B2 | 8/2011 | Ahn et al. |
| 8,071,476 B2 | 12/2011 | Ahn et al. |
| 8,076,249 B2 | 12/2011 | Ahn et al. |
| 8,084,808 B2 | 12/2011 | Ahn et al. |
| 8,093,638 B2 | 1/2012 | Ahn et al. |
| 8,093,666 B2 | 1/2012 | Ahn et al. |
| 8,110,469 B2 | 2/2012 | Gealy et al. |
| 8,125,038 B2 | 2/2012 | Ahn et al. |
| 8,154,066 B2 | 4/2012 | Ahn et al. |
| 8,278,225 B2 | 10/2012 | Ahn et al. |
| 8,288,809 B2 | 10/2012 | Ahn et al. |
| 8,399,320 B2 | 3/2013 | Ahn et al. |
| 8,399,365 B2 | 3/2013 | Ahn et al. |
| 8,405,167 B2 | 3/2013 | Ahn et al. |
| 8,445,952 B2 | 5/2013 | Ahn et al. |
| 8,455,959 B2 | 6/2013 | Ahn et al. |
| 8,524,618 B2 | 9/2013 | Ahn et al. |
| 8,541,276 B2 | 9/2013 | Ahn et al. |
| 8,558,325 B2 | 10/2013 | Ahn et al. |
| 8,685,815 B2 | 4/2014 | Ahn et al. |
| 8,765,616 B2 | 7/2014 | Ahn et al. |
| 8,895,442 B2 | 11/2014 | Ahn et al. |
| 8,907,486 B2 | 12/2014 | Ahn et al. |
| 8,951,903 B2 | 2/2015 | Gealy et al. |
| 9,496,355 B2 | 11/2016 | Kraus et al. |
| 2001/0009695 A1 | 7/2001 | Saanila et al. |
| 2001/0011740 A1 | 8/2001 | DeBoer et al. |
| 2001/0013621 A1 | 8/2001 | Nakazato |
| 2001/0024387 A1 | 9/2001 | Raaijmakers et al. |
| 2001/0051406 A1 | 12/2001 | Weimer et al. |
| 2001/0055838 A1 | 12/2001 | Walker et al. |
| 2002/0003252 A1 | 1/2002 | Iyer |
| 2002/0004279 A1 | 1/2002 | Agarwal et al. |
| 2002/0019116 A1 | 2/2002 | Sandhu et al. |
| 2002/0024083 A1 | 2/2002 | Noble et al. |
| 2002/0036939 A1 | 3/2002 | Tsai et al. |
| 2002/0037615 A1 | 3/2002 | Matsuo |
| 2002/0063294 A1 | 5/2002 | Brown et al. |
| 2002/0068466 A1 | 6/2002 | Lee et al. |
| 2002/0084480 A1 | 7/2002 | Basceri et al. |
| 2002/0086507 A1 | 7/2002 | Park et al. |
| 2002/0089023 A1 | 7/2002 | Yu et al. |
| 2002/0115252 A1 | 8/2002 | Haukka et al. |
| 2002/0117704 A1 | 8/2002 | Gonzalez |
| 2002/0132374 A1 | 9/2002 | Basceri et al. |
| 2002/0146916 A1 | 10/2002 | Irino et al. |
| 2002/0172768 A1 | 11/2002 | Endo et al. |
| 2002/0175326 A1 | 11/2002 | Reed et al. |
| 2002/0176293 A1 | 11/2002 | Forbes et al. |
| 2002/0177282 A1 | 11/2002 | Song |
| 2002/0192919 A1 | 12/2002 | Bothra |
| 2002/0197881 A1 | 12/2002 | Ramdani et al. |
| 2003/0001194 A1 | 1/2003 | DeBoer et al. |
| 2003/0003621 A1 | 1/2003 | Rhodes et al. |
| 2003/0003635 A1 | 1/2003 | Paranjpe et al. |
| 2003/0008243 A1 | 1/2003 | Ahn et al. |
| 2003/0013260 A1 | 1/2003 | Gossmann et al. |
| 2003/0015769 A1 | 1/2003 | DeBoer et al. |
| 2003/0025142 A1 | 2/2003 | Rhodes et al. |
| 2003/0030093 A1 | 2/2003 | Agarwal et al. |
| 2003/0042528 A1 | 3/2003 | Forbes |
| 2003/0049900 A1 | 3/2003 | Forbes et al. |
| 2003/0049942 A1 | 3/2003 | Haukka et al. |
| 2003/0072975 A1* | 4/2003 | Shero .................. C23C 16/308 428/704 |
| 2003/0087510 A1 | 5/2003 | Chen |
| 2003/0104666 A1 | 6/2003 | Bojarczuk, Jr. et al. |
| 2003/0116804 A1 | 6/2003 | Visokay et al. |
| 2003/0141560 A1 | 7/2003 | Sun |
| 2003/0194853 A1 | 10/2003 | Jeon |
| 2003/0205774 A1 | 11/2003 | Hokazono |
| 2003/0207593 A1 | 11/2003 | Derderian et al. |
| 2003/0224600 A1 | 12/2003 | Cao et al. |
| 2003/0228747 A1 | 12/2003 | Ahn et al. |
| 2003/0232501 A1 | 12/2003 | Kher et al. |
| 2003/0232511 A1 | 12/2003 | Metzner et al. |
| 2003/0235961 A1 | 12/2003 | Metzner et al. |
| 2004/0004247 A1 | 1/2004 | Forbes et al. |
| 2004/0009679 A1 | 1/2004 | Yeo et al. |
| 2004/0012043 A1 | 1/2004 | Gealy et al. |
| 2004/0023516 A1 | 2/2004 | Londergan et al. |
| 2004/0032773 A1 | 2/2004 | Forbes |
| 2004/0033661 A1 | 2/2004 | Yeo et al. |
| 2004/0033681 A1 | 2/2004 | Ahn et al. |
| 2004/0033701 A1 | 2/2004 | Ahn et al. |
| 2004/0038468 A1 | 2/2004 | Hwang et al. |
| 2004/0038525 A1 | 2/2004 | Meng et al. |
| 2004/0043541 A1 | 3/2004 | Ahn et al. |
| 2004/0043557 A1 | 3/2004 | Haukka et al. |
| 2004/0043559 A1 | 3/2004 | Srividya et al. |
| 2004/0043569 A1 | 3/2004 | Ahn et al. |
| 2004/0043635 A1 | 3/2004 | Vaartstra |
| 2004/0087124 A1 | 5/2004 | Kubota et al. |
| 2004/0099889 A1 | 5/2004 | Frank et al. |

(56) References Cited

U.S. PATENT DOCUMENTS

| | | |
|---|---|---|
| 2004/0102002 A1 | 5/2004 | Sandhu et al. |
| 2004/0110391 A1 | 6/2004 | Ahn et al. |
| 2004/0160830 A1 | 8/2004 | Forbes |
| 2004/0164365 A1 | 8/2004 | Ahn et al. |
| 2004/0168627 A1 | 9/2004 | Conley, Jr. et al. |
| 2004/0171280 A1 | 9/2004 | Conley, Jr. et al. |
| 2004/0183143 A1 | 9/2004 | Matsuo |
| 2004/0198069 A1 | 10/2004 | Metzner et al. |
| 2004/0203254 A1 | 10/2004 | Conley, Jr. et al. |
| 2004/0207038 A1 | 10/2004 | Hofmann et al. |
| 2004/0219783 A1 | 11/2004 | Ahn et al. |
| 2004/0224466 A1 | 11/2004 | Basceri et al. |
| 2004/0224467 A1 | 11/2004 | Basceri et al. |
| 2004/0235313 A1 | 11/2004 | Frank et al. |
| 2004/0264236 A1 | 12/2004 | Chae et al. |
| 2004/0266217 A1 | 12/2004 | Kim et al. |
| 2005/0009335 A1 | 1/2005 | Dean et al. |
| 2005/0012975 A1 | 1/2005 | George et al. |
| 2005/0023574 A1 | 2/2005 | Forbes et al. |
| 2005/0023584 A1 | 2/2005 | Derderian et al. |
| 2005/0023594 A1 | 2/2005 | Ahn et al. |
| 2005/0026349 A1 | 2/2005 | Forbes et al. |
| 2005/0026403 A1 | 2/2005 | Lee et al. |
| 2005/0026458 A1 | 2/2005 | Basceri et al. |
| 2005/0032299 A1 | 2/2005 | Basceri et al. |
| 2005/0045943 A1 | 3/2005 | Lung |
| 2005/0124174 A1 | 6/2005 | Ahn et al. |
| 2005/0152094 A1 | 7/2005 | Jeong et al. |
| 2005/0153571 A1 | 7/2005 | Senzaki |
| 2005/0169054 A1 | 8/2005 | Forbes |
| 2005/0201149 A1 | 9/2005 | Duan et al. |
| 2005/0275033 A1 | 12/2005 | Zhu et al. |
| 2005/0277256 A1 | 12/2005 | Ahn et al. |
| 2006/0001151 A1 | 1/2006 | Ahn et al. |
| 2006/0008966 A1 | 1/2006 | Forbes et al. |
| 2006/0019501 A1 | 1/2006 | Jin et al. |
| 2006/0022283 A1 | 2/2006 | Thomas et al. |
| 2006/0024975 A1 | 2/2006 | Ahn et al. |
| 2006/0033165 A1 | 2/2006 | Chan et al. |
| 2006/0043504 A1 | 3/2006 | Ahn et al. |
| 2006/0054943 A1 | 3/2006 | Li et al. |
| 2006/0125030 A1 | 6/2006 | Ahn et al. |
| 2006/0128168 A1 | 6/2006 | Ahn et al. |
| 2006/0170032 A1 | 8/2006 | Bhattacharyya |
| 2006/0176645 A1 | 8/2006 | Ahn et al. |
| 2006/0177975 A1 | 8/2006 | Ahn et al. |
| 2006/0183272 A1 | 8/2006 | Ahn et al. |
| 2006/0189154 A1 | 8/2006 | Ahn et al. |
| 2006/0189164 A1 | 8/2006 | Okabe et al. |
| 2006/0208215 A1 | 9/2006 | Metzner et al. |
| 2006/0228868 A1 | 10/2006 | Ahn et al. |
| 2006/0237764 A1 | 10/2006 | Ahn et al. |
| 2006/0237803 A1 | 10/2006 | Zhu et al. |
| 2006/0246741 A1 | 11/2006 | Ahn et al. |
| 2006/0252211 A1 | 11/2006 | Ahn et al. |
| 2006/0257563 A1 | 11/2006 | Doh et al. |
| 2006/0258097 A1 | 11/2006 | Forbes et al. |
| 2006/0261376 A1 | 11/2006 | Forbes et al. |
| 2006/0261397 A1 | 11/2006 | Ahn et al. |
| 2006/0263972 A1 | 11/2006 | Ahn et al. |
| 2006/0263981 A1 | 11/2006 | Forbes |
| 2006/0264064 A1 | 11/2006 | Ahn et al. |
| 2006/0267113 A1 | 11/2006 | Tobin et al. |
| 2006/0274580 A1 | 12/2006 | Forbes |
| 2007/0007560 A1 | 1/2007 | Forbes et al. |
| 2007/0007635 A1 | 1/2007 | Forbes et al. |
| 2007/0010060 A1 | 1/2007 | Forbes et al. |
| 2007/0010061 A1 | 1/2007 | Forbes et al. |
| 2007/0020835 A1 | 1/2007 | Ahn et al. |
| 2007/0045752 A1 | 3/2007 | Forbes et al. |
| 2007/0049023 A1 | 3/2007 | Ahn et al. |
| 2007/0087563 A1 | 4/2007 | Ahn et al. |
| 2007/0090441 A1 | 4/2007 | Ahn et al. |
| 2007/0105313 A1 | 5/2007 | Forbes |
| 2007/0111544 A1 | 5/2007 | Ahn |
| 2007/0178643 A1 | 8/2007 | Forbes et al. |
| 2007/0187772 A1 | 8/2007 | Ahn et al. |
| 2007/0234949 A1 | 10/2007 | Ahn et al. |
| 2008/0146042 A1* | 6/2008 | Kostamo ............... C23C 16/40 438/778 |
| 2012/0202358 A1 | 8/2012 | Gealy et al. |
| 2015/0318369 A1 | 11/2015 | Kraus et al. |

OTHER PUBLICATIONS

Aarik, J., et al., "Phase transformations in hafnium dioxide thin films grown by atomic layer deposition at high temperatures", Applied Surface Science, 173(1-2), (Mar. 2001), 15-21.

Aarik, Jaan, "Influence of substrate temperature on atomic layer growth and properties of HfO/sub 2/ thin films", Thin Solid Films, 340(1-2), (1999), 110-116.

Aarik, Jaan, et al., "Texture development in nanocrystalline hafnium dioxide thin films grown by atomic layer deposition", Journal of Crystal Growth, 220(1-2), (Nov. 15, 2000), 105-113.

Ahn, et al., "ALD of Zr-Substituted BaTiO3 Films as Gate Dielectrics", U.S. Appl. No. 11/498,559, filed Aug. 3, 2006.

Ahn, K Y, "Atomic Layer Deposited Barium Strontium Titanium Oxide Films", U.S. Appl. No. 11/510,803, filed Aug. 26, 2006.

Ahn, Kie Y, "Atomic Layer Deposition of CeO2/Al2O3 Films as Gate Dielectrics", U.S. Appl. No. 11/055,380, filed Feb. 10, 2005, 04-1094.

Ahn, Kie Y, "Cobalt Titanium Oxide Dielectric Films", U.S. Appl. No. 11/216,958, filed Aug. 31, 2005, 05-0523.

Ahn, Kie Y, et al., "Hafnium Lanthanide Oxynitride Films", U.S. Appl. No. 11/515,143, filed Aug. 31, 2006.

Ahn, Kie Y, "Lanthanum Aluminum Oxynitride Dielectric Films", U.S. Appl. No. 11/216,474, filed Aug. 31, 2005, 05-0565.

Ahn, Kie Y, "Magnesium-Doped Zinc Oxide Structures and Methods", U.S. Appl. No. 11/706,820, filed Feb. 13, 2007 (Client ref No. 06-0979).

Ahn, Kie Y, et al., "Methods to Form Dielectric Structures in Semiconductor Devices and Resulting Devices", U.S. Appl. No. 11/581,675, filed Aug. 16, 2006.

Ahn, Kie Y, "Molybdenum-Doped Indium Oxide Structures and Methods", U.S. Appl. No. 11/706,944, filed Feb. 13, 2007.

Ahn, Kie Y., et al., "Tungsten-Doped Indium Oxide Structures and Methods", U.S. Appl. No. 11/706,498, filed Feb. 13, 2007 (Client ref No. 06-06-0912).

Ahn, Kie Y., et al., "Zirconium-Doped Zinc Oxide Structures and Methods", U.S. Appl. No. 11/707,173, filed Feb. 13, 2007 (Client ref No. 06-0853).

Alers, G. B., et al., "Intermixing at the tantalum oxide/silicon interface in gate dielectric structures", Applied Physics Letters, 73(11), (Sep. 14, 1998), 1517-1519.

Bhattacharyya, Arup, "Scalable Flash/NV Structures & Devices With Extended Endurance", U.S. Appl. No. 11/592,779, filed Nov. 3, 2006, 56 pgs.

Chang, Hyo Sik, et al., "Excellent thermal stability of Al2O3/ZrO2/Al2O3 stack structure of metal-oxide-semiconductor gate dielectrics application", Applied Physics Letters, 80(18), (May 6, 2002), 3385-7.

Chen, F., "A study of mixtures of HfO2 and TiO2 as high-k gate dielectrics", Microelectronic Engineering 72, (2004), 263.

Chin, A., et al., "High Quality La2O3 and Al2O3 Gate Dielectrics with Equivalent Oxide Thickness 5-10A", Digest of Technical Papers. 2000 Symposium on VLSI Technology, 2000, Honolulu, (Jun. 13-15, 2000), 16-17.

Colombo, D., et al., "Anhydrous Metal Nitrates as Volatile Single Source Precursors for the CVD of Metal Oxide Films", Communications, Department of EE, U of M, Mpls, MN, (Jul. 7, 1998), 3 pages.

Eldridge, J.M., et al., "The Growth of Thin PbO Layers on Lead Films", Surface Science, 40, (1973), 512-530.

Farrar, Paul A, "Controlling Diffusion in Doped Semiconductor Regions", U.S. Appl. No. 11/982,107, filed Nov. 1, 2007, 31 pgs.

Forbes, "Hafnium Aluminium Oxynitride High-K Dielectric and Metal Gates", U.S. Appl. No. 11/514,558, filed Aug. 31, 2006.

(56) References Cited

OTHER PUBLICATIONS

Forbes, "Hafnium Tantalum Oxynitride High-K Dielectric and Metal Gates", U.S. Appl. No. 11/515,114, filed Aug. 31, 2005.
Forbes, et al., "Tantalum Aluminum Oxynitride High-K Dielectric and Metal Gates", U.S. Appl. No. 11/514,655, filed Aug. 31, 2006.
Forbes, Leonard, "Memory Utilizing Oxide Nanolaminates", U.S. Appl. No. 11/458,854, filed Jul. 20, 2006, 58 pgs.
Forbes, Leonard, "Memory Utilizing Oxide-Conductor Nanolaminates", U.S. Appl. No. 11/496,196, filed Jul. 31, 2006, 58 pgs.
Forbes, Leonard, et al., "Silicon Lanthanide Oxynitride Films", U.S. Appl. No. 11/514,533, filed Aug. 31, 2006.
Forbes, Leonard, et al., "Tantalum Silicon Oxynitride High-K Dielectrics and Metal Gates", U.S. Appl. No. 11/514,601, filed Aug. 31, 2006.
Gutowski, M J, "Thermodynamic stability of high-K dielectric metal oxides ZrO/sub 2/ and HfO/sub 2/ in contact with Si and SiO/sub 2/", Applied Physics Letters, 80(11), (Mar. 18, 2002), 1897-1899.
Iwamoto, K., "Advanced Layer-By-Layer Deposition and Annealing Process for High-Quality High-K Dielectrics Formation", Electrochemical Society Proceedings vol. 2003 (14), (2003), 265-272.
Jin, C., et al., "Porous Xerogel Films as Ultra-low Permittivity Dielectrics for ULSI Interconnect Applications", Conference Proceedings ULSI XII—1997 Materials Research Society, (1997), 463-469.
Kim, et al., "Atomic layer chemical vapor deposition (ALCVD) of Hf and Zr silicate and aluminate high-k gate dielectric for next generation nano devices", Journal of Chemical Engineering of Japan, vol. 38, No. 8, (2005), 578-587.
Kim, D., et al., "Atomic Control of Substrate Termination and Heteroepitaxial Growth of SrTiO3/LaAlO3 Films", Journal of the Korean Physical Society, 36(6), (Jun. 2000), 444-448.
Klaus, J. W, et al., "Atomic Layer Deposition of Tungsten Nitride Films using Sequential Surface Reactions", Journal of the Electrochemical Society; 147(3), (2000), 1175-1181.
Krauter, G., et al., "Room Temperature Silicon Wafer Bonding with Ultra-Thin Polymer Films", Advanced Materials, 9(5), (1997), 417-420.
Kukli, K J, et al., "Properties of hafnium oxide films grown by atomic layer deposition from hafnium tetraiodide and oxygen", Journal of Applied Physics, 92(10), (Nov. 15, 2002), 5698-5703.
Kukli, Kaupo, "Comparison of hafnium oxide films grown by atomic layer deposition from iodide and chloride precursors", Thin Solid Films, 416, (2002), 72-79.
Kukli, Kaupo, "Dielectric Properties of Zirconium Oxide Grown by Atomic Layer Deposition from Iodide Precursor", Journal of the Electrochemical Society, 148(12), (2001), F227-F232.
Kukli, Kaupo, et al., "Influence of thickness and growth temperature on the properties of zirconium oxide films growth by atomic layer deposition on silicon", Thin Solid Films, 410(1-2), (2002), 53-60.
Kukli, Kaupo, "Low-Temperature Deposition of Zirconium Oxide-Based Nanocrystalline Films by Alternate Supply of Zr[OC(CH3)3]4 and H2O", Chemical Vapor Deposition, 6(6), (2000), 297-302.
Leskela, M, "ALD precursor chemistry: Evolution and future challenges", Journal de Physique IV (Proceedings), 9(8), (Sep. 1999), 837-852.
Min, J., "Metal-organic atomic-layer deposition of titanium-silicon-nitride films", Applied Physics Letters, 75(11), (1999), 1521-1523.
Nakajima, et al., "Atomic-layer-deposited silicon-nitride/SiO2 stacked gate dielectrics for highly reliable p-metal-oxide-semiconductor filed-effect transistors", Applied Physics Letters, vol. 77, (Oct. 2000), 2855-2857.
Nakajima, Anri, "Atomic-layer deposition of ZrO/sub 2/ with a Si nitride barrier layer", Applied Physics Letters, 81(15), (Oct. 2002), 2824-2826.

Nalwa, H. S, "Handbook of Thin Film Materials", Deposition and Processing of Thin Films, vol. 1, San Diego : Academic Press, (2002), 114-119.
Ohmi, S., et al., "Rare Earth Metal Oxides for High-K Gate Insulator", Electrochemical Society Proceedings, vol. 2002-2, (2002), 376-387.
Rahtu, Antti, "Atomic Layer Deposition of Zirconium Titanium Oxide from Titanium Isopropoxide and Zirconium Chloride", Chemistry of Materials, 13(5), (May 2001), 1528-1532.
Ritala, M., "Atomic layer deposition of oxide thin films with metal alkoxides as oxygen sources", Science, 288(5464), (Apr. 14, 2000), 319-321.
Ritala, Mikko, "Atomic Layer Epitaxy Growth of Titanium, Zirconium and Hafnium Dioxide Thin Films", Annales Academiae Scientiarum Fennicae, (1994), 24-25.
Ritala, Mikko, "Zirconium dioxide thin films deposited by ALE using zirconium tetrachloride as precursor", Applied Surface Science, 75, (Jan. 1994), 333-340.
Shanware, A, et al., "Reliability evaluation of HfSiON gate dielectric film with 12.8 A SiO2 equivalent thickness", International Electron Devices Meeting. Technical Digest, (2001), 6.6.1-6.6.4.
Sneh, Ofer, "Thin film atomic layer deposition equipment for semiconductor processing", Thin Solid Films, 402(1-2), Preparation and Characterization, Elsevier Sequoia, NL, vol. 402, No. 1-2, (2002), 248-261.
Suntola, T., "Atomic Layer Epitaxy", Handbook of Crystal Growth, 3; Thin Films of Epitaxy, Part B: Growth Mechanics and Dynamics, Amsterdam, (1994), 601-663.
Suntola, Tuomo, "Atomic layer epitaxy", Thin Solid Films, 216(1), (Aug. 28, 1992), 84-89.
Viirola, H, et al., "Controlled growth of antimony-doped tin dioxide thin films by atomic layer epitaxy", Thin Solid Films, 251, (Nov. 1994), 127-135.
Wilk, G. D., "High-K gate dielectrics: Current status and materials properties considerations", Journal of Applied Physics, 89(10), (May 2001), 5243-5275.
Wolf, Stanley, et al., "Future Trends in Sputter Deposition Processes", In: Silicon Processing of the VLSI Era, vol. 1, Lattice Press, (1986), 374-380.
Wolf, Stanley, et al., "Silicon Processing for the VLSI Era—vol. I: Process Technology", Second Edition, Lattice Press, Sunset Beach, California, (2000), 443.
Xiao, et al., "Deposition of hard mental nitride-like coatings in an electro cyclotron resonance discharge", Elsevier, (Sep. 13, 2003), 389-393.
Zhang, H., "Atomic Layer Deposition of High Dielectric Constant Nanolaminates", Journal of the Electrochemical Society, 148(4), (Apr. 2001), F63-F66.
U.S. Appl. No. 11/215,451, filed Aug. 29, 20015, Systems and Apparatus for Atomic-Layer Deposition.
U.S. Appl. No. 10/789,042, filed Feb. 27, 2004, LaAlO3 Films.
U.S. Appl. No. 10/931,365, filed Aug. 31, 2004, Electronic Devices Having Lanthanide Dielectrics.
U.S. Appl. No. 11/457,978, filed Jul. 17, 2006, Nanolaminates of Hafnium Oxide and Zirconium Oxide.
U.S. Appl. No. 11/459,792, filed Jul. 25, 2006, ZrAlxOy Dielectric Layers.
U.S. Appl. No. 11/493,074, filed Jul. 26, 2006, Lanthanide Oxide/Hafnium Oxide Dielectric Layers.
U.S. Appl. No. 11/189,075, filed Jul. 25, 2005, Magnesium Titanium Oxide Films.
U.S. Appl. No. 11/215,578, filed Aug. 29, 2005, Zirconium-Doped Gadolinium Oxide Films.
U.S. Appl. No. 12/542,423, filed Aug. 17, 2009, Conductive Nanoparticles.

* cited by examiner

GRADED DIELECTRIC STRUCTURES

PRIORITY APPLICATION

This application is a divisional of U.S. application Ser. No. 13/366,025, filed Feb. 3, 2012, which is a divisional of U.S. application Ser. No. 11/216,542, filed Aug. 30, 2005, now issued as U.S. Pat. No. 8,110,469, all of which are incorporated herein by reference in their entirety.

TECHNICAL FIELD

This application relates generally to semiconductor devices and device fabrication and, more particularly, to dielectric layers and their method of fabrication.

BACKGROUND

Higher capacitance, lower leakage dielectric layers for capacitor dielectric and transistor gate applications are needed for scaling down device dimensions to realize a higher density memory. An approach to increasing the capacitance is to increase the dielectric constant of the capacitor dielectric. Although metal oxide dielectric films, such as $HfO_2$, have higher dielectric constants compared to $SiO_2$ and $Al_2O_3$, such metal oxide dielectrics typically exhibit higher leakage current. In order to reduce this leakage current to acceptable levels for these films, these metal oxide films are formed as thicker dielectric films. Forming the thicker metal oxide dielectric in turn reduces the capacitance of the structure. Additionally, the thermal stability of some metal oxides may be poor, presumably due to crystallization at higher temperature, where the crystallization temperature decreases with increased film thickness.

DETAILED DESCRIPTION

The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized and structural, logical, and electrical changes may be made without departing from the scope of the present invention. The various embodiments are not necessarily mutually exclusive, as some embodiments can be combined with one or more other embodiments to form new embodiments.

The terms wafer and substrate used in the following description include any structure having an exposed surface with which to form an integrated circuit (IC) structure. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to generally include n-type and p-type semiconductors and the term insulator or dielectric is defined to include any material that is less electrically conductive than the materials referred to as conductors.

A dielectric film has both a physical dielectric thickness and an equivalent oxide thickness ($t_{eq}$). The equivalent oxide thickness quantifies the electrical properties, such as capacitance, of the dielectric film in terms of a representative physical thickness. $t_{eq}$ is defined as the thickness of a theoretical $SiO_2$ layer that would be required to have the same capacitance density as a given dielectric, ignoring leakage current and reliability considerations.

For some typical dielectric layers, the capacitance is determined as one for a parallel plate capacitance: $C=\kappa\epsilon_0 A/t$, where $\kappa$ is the dielectric constant, $\epsilon_0$ is the permittivity of free space, A is the area of the capacitor, and t is the thickness of the dielectric. The thickness, t, of a material is related to its $t_{eq}$ for a given capacitance, with $SiO_2$ having a dielectric constant $\kappa_{ox}=3.9$, as $$t=(\kappa/\kappa_{ox})t_{eq}=(\kappa/3.9)t_{eq}.$$

Thus, materials with a dielectric constant greater than that of $SiO_2$, 3.9, will have a physical thickness that can be considerably larger than a desired $t_{eq}$, while providing the desired equivalent oxide thickness. For example, an alternate dielectric material with a dielectric constant of 10 could have a thickness of about 25.6 Å to provide a $t_{eq}$ of 10 Å, not including any depletion/inversion layer effects. Thus, a reduced equivalent oxide thickness for transistors can be realized by using dielectric materials with higher dielectric constants than $SiO_2$.

One of the advantages using $SiO_2$ as a gate dielectric or a capacitor dielectric has been that the formation of the $SiO_2$ layer results in an amorphous dielectric. Having an amorphous structure for a dielectric provides for reducing problems of leakage current associated with grain boundaries in polycrystalline dielectrics that provide high leakage paths. Additionally, grain size and orientation changes throughout a polycrystalline dielectric can cause variations in the film's dielectric constant, along with uniformity and surface topography problems. Typically, materials having the advantage of a high dielectric constant relative to $SiO_2$ also have the disadvantage of a crystalline form, at least in a bulk configuration. The best candidates for replacing $SiO_2$ as a gate dielectric or a capacitor dielectric are those with high dielectric constant, which can be fabricated as a thin layer with an amorphous form.

Candidates to replace $SiO_2$ include high-κ dielectric materials. High-K materials include materials having a dielectric constant greater than silicon dioxide, for example, dielectric materials having a dielectric constant greater than about twice the dielectric constant of silicon dioxide. A set of high-κ dielectric candidates for replacing silicon oxide as the dielectric material in electronic components in integrated circuit includes lanthanide oxides, $HfO_2$, $ZrO_2$, $TiO_2$, and other binary metal oxides.

An embodiment for a method of forming an electronic device includes forming a graded dielectric layer in an integrated circuit including controlling a doping profile of the dielectric layer formed substantially as monolayers across the dielectric layer. An embodiment for a method of forming an electronic device includes forming a graded dielectric layer in an integrated circuit including controlling a structure profile of the dielectric layer that varies across the dielectric layer. In an embodiment, a dielectric layer is formed using a pulsing sequence of a component precursor/a dopant precursor/a reactant precursor and varying the order of pulsing the component precursor and the dopant precursor. Embodiments provide for capacitors, transistors, memory devices, and electronic systems having structures including a graded dielectric layer, and methods for forming such structures.

In an embodiment, a dielectric layer has a number of regions with varying characteristics across the dielectric layer to provide a graded dielectric layer. The regions may be multiple layers of the dielectric layer, where these multiple layers may be referred to as sub-layers or films within the dielectric layer. The films may have a thickness ranging from a number of monolayers to thousands of Angstroms or more depending on the electronic device in which the dielectric layer is located. The varying characteristics may include a dopant profile across the dielectric layer, a structure profile across the dielectric layer, or a dopant profile across the dielectric layer and a structure profile across the dielectric layer. Herein, a structure profile that varies across a dielectric layer includes one or more layers of crystalline material and one or more layers of amorphous material. In an embodiment, the graded dielectric layer may include a metal oxide. The metal oxide may be doped with silicon. The metal oxide may be doped with a metal dopant. The metal oxide may include hafnium oxide, zirconium oxide, hafnium oxide doped with silicon, hafnium oxide doped with a metal dopant, zirconium oxide doped with silicon, zirconium oxide doped with a metal dopant, or combinations of doped and undoped metal oxides.

Embodiments of graded dielectric layers may be formed using a variety of fabrication techniques. In an embodiment, a dopant element or elements are added to a dielectric material in a uniform, controlled manner to reduce the leakage current properties of the dielectric material with minimum detrimental impact on the dielectric constant of the dielectric material. As a result, the dielectric material may have a relatively low leakage without compromising capacitance for an electronic device in which the dielectric material is disposed. In an embodiment, a method includes fabricating a hafnium based dielectric, such as a $HfO_2$ film, having a silicon dopant. Since a hafnium oxide film having a silicon dopant may have a low leakage film, much thinner hafnium oxide dielectrics may be formed compared to a conventional $HfO_2$ film. Embodiments may include hafnium based dielectrics having one or more metal dopants. In an embodiment, a graded dielectric layer is formed by atomic layer deposition (ALD) or a variation thereof.

ALD, also known as atomic layer epitaxy (ALE), is a modification of chemical vapor deposition (CVD) and is also called "alternately pulsed-CVD." In ALD, gaseous precursors are introduced one at a time to the substrate surface mounted within a reaction chamber (or reactor). This introduction of the gaseous precursors takes the form of pulses of each gaseous precursor. In a pulse of a precursor gas, the precursor gas is made to flow into a specific area or region for a short period of time. Between the pulses, the reaction chamber may be purged with a gas, where in many cases the purge gas is an inert gas. Between the pulses, the reaction chamber may be evacuated. Between the pulses, the reaction chamber may be purged with a gas and evacuated. The pulses may be switched between reactant gases, essentially providing a "zero second" purge.

In a chemisorption-saturated ALD (CS-ALD) process, during the first pulsing phase, reaction with the substrate occurs with the precursor saturatively chemisorbed at the substrate surface. Subsequent pulsing with a purging gas removes precursor excess from the reaction chamber.

The second pulsing phase introduces another precursor on the substrate where the growth reaction of the desired film takes place. Subsequent to the film growth reaction, reaction byproducts and precursor excess are purged from the reaction chamber. With favourable precursor chemistry where the precursors adsorb and react with each other on the substrate aggressively, one ALD cycle can be performed in less than one second in properly designed flow type reaction chambers. Typically, precursor pulse times range from about 0.5 sec to about tens of seconds.

In ALD, the saturation of all the reaction and purging phases makes the growth self-limiting. This self-limiting growth results in large area uniformity and conformality, which has important applications for such cases as planar substrates, deep trenches, and in the processing of porous silicon and high surface area silica and alumina powders. Significantly, ALD provides for controlling film thickness in a straightforward manner by controlling the number of growth cycles.

The precursors used in an ALD process may be gaseous, liquid or solid. However, liquid or solid precursors should be volatile. The vapor pressure should be high enough for effective mass transportation. In addition, solid and some liquid precursors may need to be heated inside the reaction chamber and introduced through heated tubes to the substrates. The necessary vapor pressure should be reached at a temperature below the substrate temperature to avoid the condensation of the precursors on the substrate. Due to the self-limiting growth mechanisms of ALD, relatively low vapor pressure solid precursors can be used though evaporation rates may vary somewhat during the process because of changes in their surface area.

There are several other characteristics for precursors used in ALD. The precursors should be thermally stable at the substrate temperature, because their decomposition may destroy the surface control and accordingly the advantages of the ALD method that relies on the reaction of the precursor at the substrate surface. A slight decomposition, if slow compared to the ALD growth, can be tolerated.

The precursors should chemisorb on or react with the surface, though the interaction between the precursor and the surface as well as the mechanism for the adsorption is different for different precursors. The molecules at the substrate surface should react aggressively with the second precursor to form the desired solid film. Using highly reactive precursors in ALD contrasts with the selection of precursors for conventional CVD. The by-products in the reaction should be gaseous in order to allow their easy removal from the reaction chamber.

In a reaction sequence ALD (RS-ALD) process, the self-limiting process sequence involves sequential surface chemical reactions. RS-ALD relies on chemistry between a reactive surface and a reactive molecular precursor. In an RS-ALD process, molecular precursors are pulsed into the ALD reaction chamber separately. A metal precursor reaction at the substrate is typically followed by an inert gas pulse to remove excess precursor and by-products from the reaction chamber prior to pulsing the next precursor of the fabrication sequence.

By RS-ALD, films can be layered in equal metered sequences that are all identical in chemical kinetics, deposition per cycle, composition, and thickness. RS-ALD sequences generally deposit less than a full layer per cycle. Typically, a deposition or growth rate of about 0.25 to about 2.00 Å per RS-ALD cycle can be realized.

Figure 1:
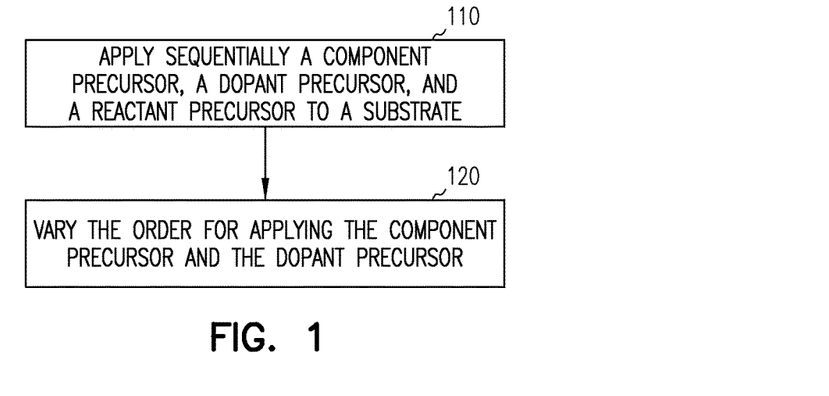
FIG. 1 depicts features of an embodiment of a method to form a graded dielectric layer.

The advantages of RS-ALD include continuity at an interface avoiding poorly defined nucleating regions that are typical for chemical vapor deposition (<20 Å) and physical vapor deposition (<50 Å), conformality over a variety of substrate topologies due to its layer-by-layer deposition technique, use of low temperature and mildly oxidizing processes, lack of dependence on the reaction chamber, growth thickness dependent solely on the number of cycles performed, and ability to engineer multilayer laminate films with resolution of one to two monolayers. RS-ALD processes allows for deposition control on the order on monolayers and the ability to deposit monolayers of amorphous films. In an embodiment, ALD processes may allow composition control within each monolayer FIG. 1 shows features of an embodiment of a method to form a graded dielectric layer. At 110, a precursor for a component element of the dielectric layer, a dopant precursor, and a reactant precursor are sequentially applied to a substrate. This application scheme provides for applying both the component element precursor and the dopant precursor prior to applying the reactant precursor. For a metal oxide having a metal dopant, the scheme may be referred to as a MMO scheme. For a metal oxide having a silicon dopant, the scheme may be referred to as a MSO scheme. At 120, the order for applying the precursor for the component element and the dopant precursor is varied. An application cycle may include a MSO sequence followed by another MSO sequence. Varying the order may include a cycle having a SMO sequence followed by a MSO sequence. Varying the order to the application of the precursors for the component element and the dopant provides an alternating cycle scheme. Appling an alternating cycle scheme to a MSO scheme, a MMO scheme, or a variation thereof may be controlled to provide substantially mixed layers of component element and dopant at each sub-layer of a dielectric layer The amount of dopant incorporated into the formed dielectric may be controlled by the order that the component element precursor comes in the cycle with respect to the dopant precursor. In an embodiment, the amount of dopant depends on the first precursor applied. In an embodiment, the dielectric material includes a metal oxide, such as, but not limited to, a hafnium oxide. In an embodiment, the component element is a metal of the metal oxide and the dopant includes silicon.

Various embodiments of a method for forming a dielectric layer overcome problems associated with introducing controlled amounts of a dopant typically associated with both the control of the doping process and the lack of well behaved precursors for the dielectric component element and the dopant. For example, problems of depositing a silicon dopant in a metal oxide, such as hafnium oxide, may arise due to differences in typical processing temperatures for the silicon and the metal oxide. In an embodiment, hafnium oxide having silicon dopant is deposited on a substrate in an integrated circuit by atomic layer deposition. In an embodiment, a hafnium oxide film is formed by ALD with a thickness in the range from about 60 Å to about 100 Å with a silicon uniformly distributed in the film. The uniform distribution of silicon may include uniformly varying silicon concentration between selected regions in the hafnium oxide film. In an embodiment, silicon doped hafnium oxide is formed by ALD using a MSO scheme combined with an alternating cycle scheme. In an embodiment, silicon may be distributed in quantized amounts across the hafnium oxide layer to provide a varying dopant profile across the hafnium oxide layer. Quantized doping may be can be accomplished using intermittent (periodic) atomic layer deposition cycles of a silicon source. In various embodiments, a zirconium oxide layer may be formed in place of or in combination with a hafnium oxide layer.

In an embodiment, a method includes varying silicon concentration uniformly from about a 1:30 to 1:2 Si:Hf ratio. In an embodiment, a method includes varying silicon concentration uniformly from about a 1:15 to 1:1 Si:Hf ratio. In an embodiment, any of the amido hafnium precursors may be used as a Hf source and TDMAS (tetraksdimethyl amido Si) may be used as a tractable Si source. A TDMAS/oxidizer ALD process has a monotonically decreasing deposition rate, but in concert with $HfO_x$ or sequentially with amido Hf precursors, the deposition rate may be controlled and moderated. In an embodiment, silicon is incorporated in hafnium oxide using a pulse/purge sequence such as: Hf/purge/Si/purge/$O_3$/purge/Hf/purge/$O_3$/purge/Si/purge/$O_3$/purge, where Hf comes from an amido Hf precursor and Si comes from a TDMAS precursor. In an embodiment, this entire pulse/purge sequence constitutes one cycle, a MSO/MO/SO cycle. This cycle can be repeated any number of times to realize the desired thickness. In an embodiment, the silicon concentration may be varied by changing the order of Hf precursor pulses and the Si precursor pulses, such as: Si/purge/Hf/purge/$O_3$/purge/Si/purge/$O_3$/purge/Hf/purge/$O_3$/purge, generating a SMO/SO/MO cycle. In an embodiment, ALD processing generates silicon dopant in a hafnium oxide. In an embodiment, ALD processing generates a silicon oxide/hafnium oxide mixture. In an embodiment, ALD processing generates a hafnium silicate. In various embodiments, a zirconium oxide layer may be formed in place of or in combination with a hafnium oxide layer. In an embodiment, a method includes varying silicon concentration uniformly from about a 1:30 to 1:2 Si:Zr ratio. In an embodiment, a method includes varying silicon concentration uniformly from about a 1:15 to 1:1 Si:Zr ratio.

In an embodiment, a metal precursor is applied to provide partial monolayer coverage that allows mixture of the metal with silicon at a monolayer level with the subsequent application of the silicon precursor. In an embodiment, sequencing hafnium and then silicon generates an appropriate hafnium silicon ratio of about 22:1, and sequencing silicon and then hafnium generates a hafnium silicon ratio of about 1:3.5. In an embodiment, sequencing hafnium and then silicon generates an appropriate hafnium silicon ratio of about 22:1, and sequencing silicon and then hafnium generates a hafnium silicon ratio of about 1:5. The ratio difference is provided by changing the order. The order change allows partial but mixed layer at every sub-layer of the dielectric layer. To obtain a mixed sub-layer, the element ratio may be changed by changing the ALD process particulars. The silicon concentration may be adjusted reproducibly and uniformly over a large range by combining MSO schemes and alternating cycle schemes. Silicon may be strongly dependent on the order that the metal (Hf) precursor is applied in the cycle. Silicon in hafnium oxide film may aid in suppressing crystallization providing better thermal stability than for conventional films.

Figure 2:
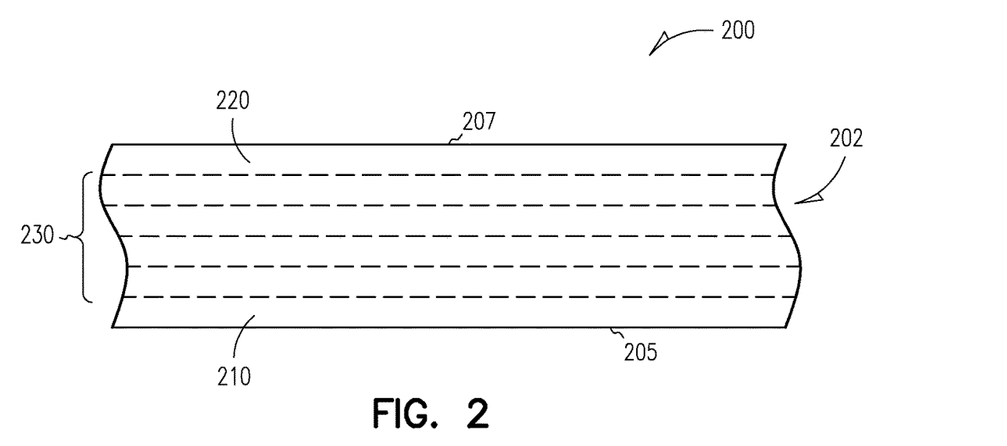
FIG. 2 depicts an embodiment of a dielectric layer for an electronic device, where the dielectric layer has a number of regions that provides a dopant profile that varies across a dielectric layer.

FIG. 2 shows an embodiment of a dielectric layer 202 for an electronic device 200, where dielectric layer 202 has a number of regions that provides a dopant profile that varies across dielectric layer 202. The dopant profile may vary continuously or in continuous segments across dielectric layer 202. Alternatively, portions of dielectric layer 202 may have a dopant profile that is relatively constant. In an embodiment, the dopant concentration of dielectric layer 202 is graded across dielectric layer 202 from a dopant concentration at an interface 205 to a region or a point within dielectric layer 202 at which there is no dopant concentration or the dopant concentration is substantially less than that at interface 205 and graded back to a dopant concentration at an opposite interface 207 that is at a dopant level near or at that of interface 205. An embodiment provides for any dopant profile across dielectric layer 202 that is not substantially constant across the entire dielectric layer.

Dielectric layer 202 may be formed as a fixed number of regions. Dielectric layer 202 may be configured as a nanolaminate structure with distinct layers. The term "nanolaminate" means a composite film of ultra thin layers of two or more materials in a layered stack. Typically, each layer in a nanolaminate has a thickness of an order of magnitude in the nanometer range. Further, each individual material layer of the nanolaminate can have a thickness as low as a monolayer of the material or as high as 20 nanometers.

Dielectric layer 202 may be configured as a graded structure within quantized deposition levels generated in the formation of dielectric layer 202. In an example embodiment, dielectric layer 202 includes regions 210, 230, and 220, where regions 210, 220, and 230 provide dielectric layer 203 with a varying dopant profile. Regions 210, 230, and 220 include a dopant concentration such that the dopant concentration is not constant across dielectric layer 202. Region 230 may be lightly doped or undoped with regions 210, 220 having a higher concentration of the dopant element or elements. The dopant profile may provide for the largest dopant concentration at one or both of interfaces 205, 207. The dopant profile may include quantized levels such that regions 210, 220, 230 have a relatively constant dopant profile, which is not at the same level across all regions. In an embodiment, regions 210, 230, and 220 may be configured as a nanolaminate. Dielectric layer 202 is not limited to three regions, but may include any number of regions depending on the application.

In embodiment, dielectric layer 202 may be a metal oxide. Dielectric layer 202 may be a metal oxide having a silicon dopant, other non-metal dopant, or a silicon dopant and other non-metal dopant. Dielectric layer 202 may be a metal oxide having one or more metal dopants. Dielectric layer 202 may be a metal oxide having one or more metal dopants and a silicon dopant, another non-metal dopant, or a silicon dopant and another non-metal dopant. In an embodiment, dielectric layer 202 includes a silicon doped hafnium oxide. A silicon doped hafnium oxide may be configured with the silicon content graded across the hafnium oxide. In an embodiment, silicon content is graded across a hafnium oxide dielectric layer having a thickness in the range from about 60 Angstroms to about 100 Angstroms. In an embodiment, at interface 205, a silicon doped hafnium oxide has a Hf:Si ratio of about 2:1 to 3:1, that is, the hafnium oxide is silicon-rich. Herein, silicon-rich metal oxide means having a silicon to metal ratio of 1:5 or larger. Within this definition of silicon-rich metal oxide is included a traditional view of silicon-rich in which a silicon metal oxide has an atomic percentage of silicon being greater than the atomic percentage of the metal. The silicon content is graded such that a region or level in the hafnium oxide has either no silicon or substantially less silicon than at interface 205, such as less than a 1:20 (Si:Hf) ratio. From this low silicon content region, the hafnium oxide has a silicon content graded back to a silicon-rich content at opposite interface 207 such as a silicon content having a 2:1 to 3:1 (Hf:Si) ratio. In an embodiment, silicon-rich regions having a Hf:Si ratio of about 2:1 to 3:1 may extend to about 20 or about 30 Angstroms from one or both of the interfaces 205, 207 towards the hafnium-rich region within dielectric layer 202. In an embodiment, silicon-rich regions having a Hf:Si ratio of about 2:1 to 5:1 may extend to about 20 or about 30 Angstroms from one or both of the interfaces 205, 207 towards the hafnium-rich region within dielectric layer 202. The hafnium-rich region may be a center layer of region 230 having a Hf:Si ratio of about 22:1. A hafnium-rich region may be located at other regions within dielectric layer 202 other than the center layer, with a silicon-rich hafnium oxide layer at one or both interfaces. In various embodiments, a zirconium oxide layer may be formed in place of or in combination with a hafnium oxide layer.

In an embodiment, the silicon doped hafnium oxide dielectric layer, as dielectric layer 202 of FIG. 2, is a substantially a hafnium oxide layer having silicon dopants rather than a hafnium silicate or a mixture of silicon oxide and hafnium oxide. In an embodiment, silicon content is graded across dielectric layer 202 including a hafnium silicate layer or sub-layer. In an embodiment, silicon content is graded across dielectric layer 202 including a layer or sub-layer of a hafnium oxide-silicon oxide mixture. Dielectric layer 202 having a silicon content graded from a silicon-rich hafnium oxide layer at interface 205 to a center having hafnium oxide with effectively little or no silicon and back to a silicon-rich hafnium oxide layer at interface 207 may provide a dielectric having effective permittivity increased by about one-third relative to conventional silicon hafnium oxides. Other embodiments include aluminum doped hafnium oxide dielectric layers, aluminum or silicon doped zirconium oxide, and mixtures or variations of these dielectric materials. Various embodiments are not limited to hafnium or zirconium metal oxides, but may include any metal oxide.

In embodiment, dielectric layer is configured as a number of layers whose formation is highly controlled to provide the graded dopant profile, where the layers are constructed as a series of monolayers. Each of the monolayers contains the basic material of the primary dielectric material with dopants mixed in the monolayer. In an embodiment of a dielectric layer containing silicon doped hafnium oxide, silicon may be mixed with the hafnium at every layer at which the dielectric is structured to include silicon. The amount of silicon mixed into the monolayers of hafnium oxide is varied across the dielectric layer from one interface to the opposite interface of the dielectric layer. An interior region may be configured with little or no silicon content. In various embodiments, a zirconium oxide layer may be formed in place of or in combination with a hafnium oxide layer.

Figure 3:
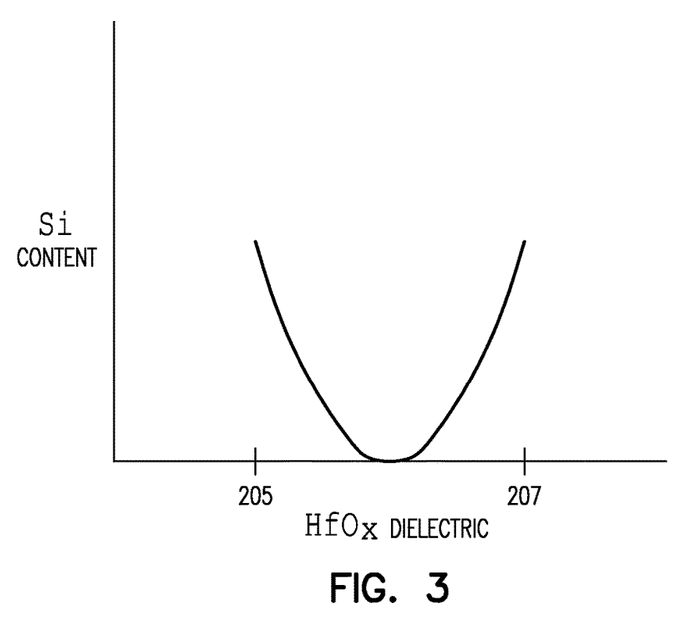
FIG. 3 illustrates an example embodiment for a dopant profile between two opposite ends of a dielectric layer, such as between the interfaces of the dielectric layer of FIG. 2.

FIG. 3 illustrates an example embodiment for a silicon dopant profile between two opposite ends of a hafnium oxide dielectric layer, such as between interface 205 and interface 207 of dielectric layer 202. In an embodiment, either or both interface 205 and interface 207 are interfaces to an insulative material. For instance, a larger dielectric structure may include dielectric layer 202 as a component. In an embodiment, either or both interface 205 and interface 207 are interfaces to a conductive material. In an embodiment, dielectric layer 202 is a capacitor dielectric in a capacitor with interfaces 205, 207 being the interfaces between the capacitor dielectric 202 and electrodes of the capacitor. In an embodiment, dielectric layer 202 is a gate dielectric in a transistor with interface 205 being the interface to the transistor channel. Interface 207 may be the interface to a control gate or a floating gate in a transistor.

Typically, crystalline dielectrics exhibit higher permittivity than their amorphous counterparts. However, they also often exhibit higher leakage currents. The higher leakage currents may reduce or even negate the benefit of high-K structures in charge storage devices or in low-power transistors, because, typically, the high-κ material must be made physically thicker to control leakage current. In an embodiment, crystalline dielectrics may be used for enhanced permittivity dielectrics with lower leakage by depositing or generating high-κ crystalline material on, in, or under an amorphous insulating material. Various embodiments include bilayers, trilayers, multiple layer dielectric stacks, or nanolaminate-type dielectrics composed of selected crystalline layers with amorphous layers. In various embodiments, the elements of the crystalline layers may differ from the elements of the amorphous layer.

An embodiment may include a single-layer amorphous dielectric with controlled nanocrystalline content within the amorphous layer. In an embodiment, a crystalline region may be configured as a wave of crystallinity, where the long range order varies across a region of the graded dielectric layer. In an embodiment, a crystalline region may be configured as a wave of crystallinity, where the crystal grain size varies across a region of the graded dielectric layer. In an embodiment, crystallinity is driven by doping factors in the material.

In an embodiment, the crystallinity of a high-κ layer is separated, via an amorphous layer or layers, from the existing crystallinity of the material on which such a structure is disposed. In an embodiment, the crystallinity of a high-κ layer is separated, via an amorphous layer or layers, from crystallization mechanical stress during downstream thermal processing induced by the material coupled above and below such structures. In an embodiment, a structure with a dielectric layer between two conductive layers, such as electrodes, has at least one amorphous layer between a crystalline region of the dielectric layer and one of the conductive layers. Having the amorphous region in such a structure may prevent grain boundaries from propagating from one conductive layer to the other conductive layer. The degree of crystallinity of a high-κ dielectric layer may be more intrinsic to its own composition, thermodynamics, and internal thermal and mechanical stresses and is less dictated by external thermal or mechanical stresses, due to inclusion of such amorphous regions.

Figure 4:
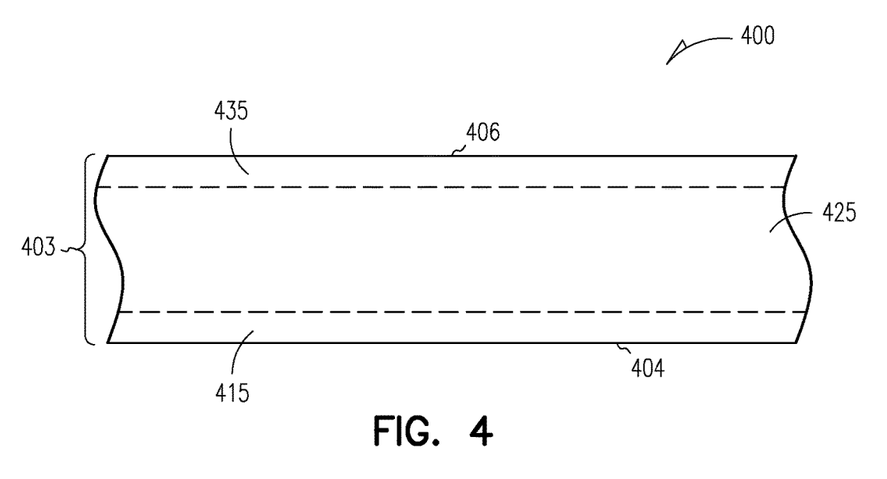
FIG. 4 shows an embodiment of a graded dielectric layer for an electronic device, where the graded dielectric layer has a number of regions that provide a structure profile that varies across the graded dielectric layer.

FIG. 4 shows an embodiment of a graded dielectric layer 403 for an electronic device 400, where graded dielectric layer 403 has a number of regions that provide a structure profile that varies across graded dielectric layer 403. In an embodiment, graded dielectric layer 403 includes a crystalline dielectric film 425 interior to graded dielectric layer 403 and an amorphous dielectric film 415 at an interface 404 of graded dielectric layer 403 with another material. In an embodiment, amorphous dielectric film 415 is coupled to a conductive layer at interface 404. In an embodiment, graded dielectric layer 403 has amorphous dielectric film 415 contacting interface 405 and an amorphous layer 435 at an interface 406. In an embodiment, interfaces 404 and 406 each couple dielectric layer 403 to conductive material. In an embodiment, region 415 may be a crystalline region in graded dielectric layer 403 that is configured with an amorphous layer 435 and a crystalline layer 425. Graded dielectric 403 may be integral to an electronic device in an integrated circuit such that charge injection occurs at interface 406. In such an electronic device, crystalline layers 425 and 415 may be configured as one layer such that graded dielectric layer 403 is a bilayer.

Crystalline content or amorphous content in discrete layers may be controlled by various techniques or combinations thereof, including atomic layer deposition compositional control, process conditions such as reactant gas selection or processing temperature, and in-situ or ex-situ annealing. For example, increasing silica incorporation in hafnium silicates raises the crystallization temperature of $HfO_2$ or $HfSiO_x$.

In an example embodiment, a graded dielectric layer having crystalline and amorphous regions may be used in capacitors to provide higher capacitance with low leakage current than expected from conventional capacitors. The graded dielectric layer may be used in capacitors having a titanium nitride electrode. The graded dielectric layer may be used in capacitors having a tantalum nitride electrode. In an embodiment, a capacitor has an amorphous silicon-rich $HfSiO_x$ layer disposed prior to a top electrode in a bilayer or trilayer dielectric stack composed of Hf-rich $HfSiO_x$ with a Hf:Si ratio of about 22:1. The top electrode may be a TiN electrode processed at temperatures as high as 600° C. The top electrode may be a TaN electrode. The presence of this top amorphous layer may prevent significant leakage current gains that would otherwise occur due to crystallization of $HfO_2$. An embodiment of a crystalline/amorphous trilayer graded dielectric structure in a capacitor dielectric stack may include a structure such as a TiN electrode\ALD Si-rich $HfSiO_x$ (amorphous) dielectric layer\ALD chloride-based $HfO_2$ or ALD amido-based $HfO_2$ or $HfAlO_x$ or ALD $HfO_xN_y$ dielectric layer\Si-rich $HfSiO_x$ (amorphous) dielectric layer\TiN electrode. Chloride-based $HfO_2$ is typically crystalline as-deposited at higher temperatures. In formation of such a structure, Amido-based $HfO_2$ and HfON films may benefit from annealing in the range of about 500° C. to about 700° C. to encourage crystallization of the middle dielectric layer prior to depositing the top amorphous dielectric layer. Such a process may encourage the top layer (Si-rich $HfSiO_x$) to remain amorphous at lower $SiO_2$ doping levels to enhance permittivity of the stack. In an embodiment, silica content in the Si-rich $HfSiO_x$ is controlled and the formation process may be conducted without a dielectric anneal. An embodiment of a layered stack that balances crystalline and amorphous components to control thermal stability in desired places within the dielectric may include TiN\thick ALD HfON\ex-situ 500° C. anneal\thin ALD Si-rich $HfSiO_x$\600° C. deposited TiN. In various embodiments, zirconium may be deposited in place of or in combination with hafnium.

In an embodiment, graded dielectric layer 403 may have amorphous dielectric film that includes a silicon-rich metal silicon oxide. A crystalline dielectric film in graded dielectric layer 403 may include a metal oxide whose metal compound includes the metal of the silicon-rich metal silicon oxide. In an embodiment, the silicon-rich metal silicon oxide includes a silicon-rich hafnium silicon oxide. The silicon-rich hafnium silicon oxide may be a silicon-rich hafnium silicate. In an embodiment, the crystalline dielectric film includes a metal oxide containing a plurality of metal species. In an embodiment, the crystalline dielectric film includes forming a metal oxynitride.

Various embodiments for forming a graded dielectric layer having a structure profile that varies across the dielectric layer include forming regions in the graded dielectric layer by atomic layer deposition. Properties of the graded dielectric layer may vary depending on the precursors used in the ALD process. For example a trimethylaluminium (TMA) precursor may behave differently at a substrate surface than an aluminum chloride precursor. Variation of the structure profile may be attained by changing precursors to obtain different compositions. In an embodiment, selection of precursors may determine the crystallinity of the dielectric layer. Chlorides tend to go down crystalline, while amides tend to provide amorphous structure.

The structure of the dielectric layer may be driven crystalline or amorphous depending on selection of such factors as the choice of precursor and reaction temperature. A stoichiometry may be approximately equivalent for two films formed using different precursors but the properties of these films may be different, providing different films for an electronic device. Further, film characteristics may change as the film crystallizes. Film compression may occur, while stresses may be relieved as the film is warmed during processing. In an embodiment, temperatures and precursors are selected to aid in forming the crystalline region, while forming an amorphous region on the crystalline region. In an embodiment, the dielectric layer may be annealed prior to forming the top amorphous region on the crystalline region.

Figure 5:
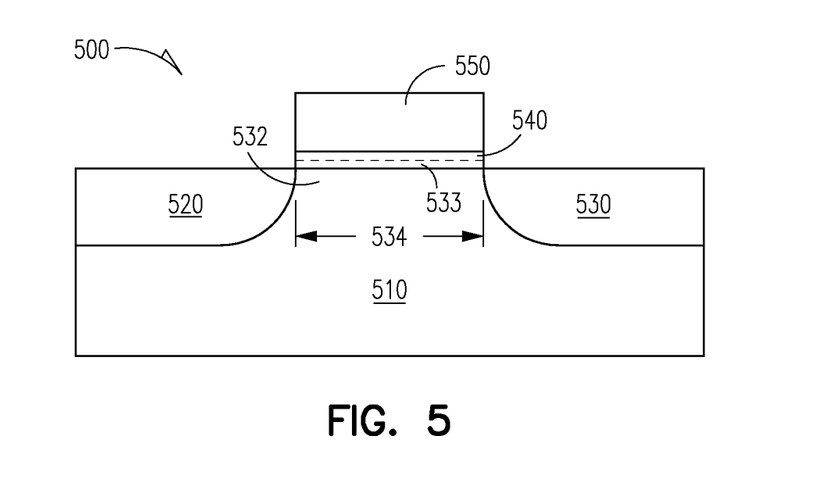
FIG. 5 shows an embodiment of a configuration of a transistor having a graded dielectric layer.

A transistor 500 as depicted in FIG. 5 may be constructed including using an embodiment for forming a graded dielectric layer. The graded dielectric layer may be formed by atomic layer deposition. Transistor 500 includes a source region 520 and a drain region 530 in a silicon based substrate 510 where source and drain regions 520, 530 are separated by a body region 532. Body region 532 defines a channel having a channel length 534. A dielectric layer is disposed on substrate 510 as a graded dielectric layer in a manner similar to an embodiment described herein. The resulting dielectric layer forms gate dielectric 540. Gate dielectric 540 may be realized as a graded dielectric layer formed substantially as monolayers across the dielectric layer having a doping profile that varies across the dielectric layer or formed substantially having a structure profile that varies across the dielectric layer. Gate dielectric 540 may be realized as a graded dielectric layer formed substantially as monolayers across the dielectric layer having a doping profile that varies across the dielectric layer and formed substantially having a structure profile that varies across the dielectric layer. Gate dielectric 540 may contain one or more insulating layers in which at least one layer is a graded dielectric layer. A gate 550 is formed over and contacts gate dielectric 540. In an embodiment, an amorphous region of gate dielectric is in contact with gate 550.

An interfacial layer 533 may form between body region 532 and gate dielectric 540. In an embodiment, interfacial layer 533 may be limited to a relatively small thickness compared to gate dielectric 540, or to a thickness significantly less than gate dielectric 540 as to be effectively eliminated. Forming the substrate, the gate, and the source and drain regions may be performed using standard processes known to those skilled in the art. Additionally, the sequencing of the various elements of the process for forming a transistor may be conducted with standard fabrication processes, also as known to those skilled in the art. In an embodiment, gate dielectric 540 may be realized as a gate insulator in a silicon CMOS transistor. Transistor 500 is not limited to silicon based substrates, but may be used with a variety of semiconductor substrates.

Figure 6:
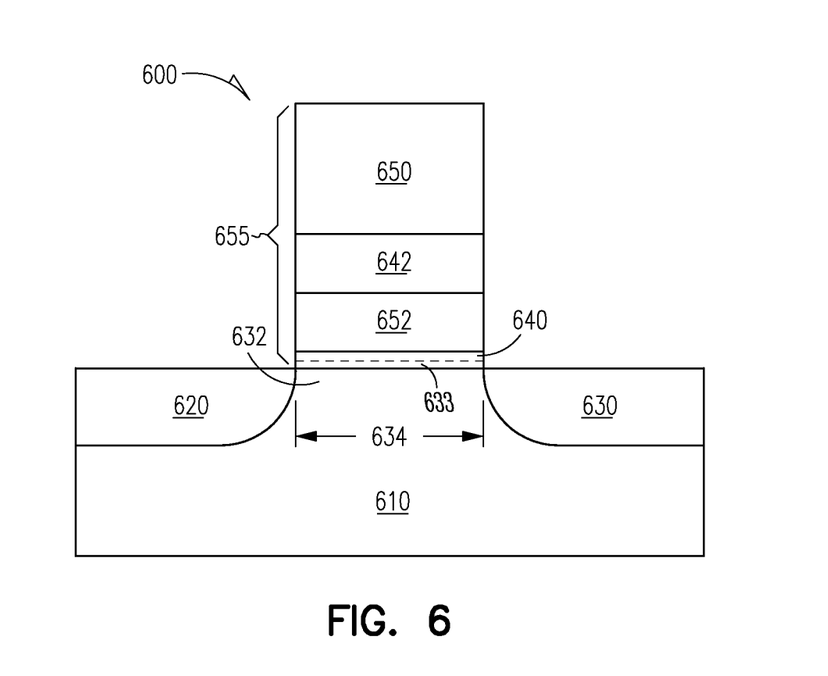
FIG. 6 shows an embodiment of a configuration of a floating gate transistor having a graded dielectric layer.

FIG. 6 shows an embodiment of a configuration of a floating gate transistor 600 having an embodiment of a graded dielectric layer. Transistor 600 includes a silicon based substrate 610 with a source 620 and a drain 630 separated by a body region 632. However, transistor 600 is not limited to silicon based substrates, but may be used with a variety of semiconductor substrates. Body region 632 between source 620 and drain 630 defines a channel region having a channel length 634. Located above body region 632 is a stack 655 including a gate dielectric 640, a floating gate 652, a floating gate dielectric 642, and a control gate 650. An interfacial layer 633 may form between body region 632 and gate dielectric 640. In an embodiment, interfacial layer 633 may be limited to a relatively small thickness compared to gate dielectric 640, or to a thickness significantly less than gate dielectric 640 as to be effectively eliminated.

Gate dielectric 640 includes a graded dielectric layer formed in embodiments similar to those described herein. Gate dielectric 640 may be realized as a graded dielectric layer with an amorphous layer contacting floating gate 652. Gate dielectric 640 may include one or more dielectric layers in which at least one layer is a graded dielectric layer.

In an embodiment, floating gate dielectric 642 includes a graded dielectric layer formed in embodiments similar to those described herein. Floating gate dielectric 642 may include one or more insulating layers in which at least one layer is a graded dielectric layer. In an embodiment, control gate 650 is formed over and contacts an amorphous layer of floating gate dielectric 642.

Alternatively, both gate dielectric 640 and floating gate dielectric 642 may be formed containing a graded dielectric layer. Floating gate 652 and floating gate dielectric 642 may be realized by embodiments similar to those described herein with the remaining elements of the transistor 600 formed using processes known to those skilled in the art. In an embodiment, gate dielectric 640 forms a tunnel gate insulator and floating gate dielectric 642 forms an inter-gate insulator in flash memory devices, where gate dielectric 640, floating gate dielectric 642 gate, or dielectric 640 and floating gate dielectric 642 include a graded dielectric layer. Use of graded dielectric layers for a gate dielectric or a floating gate dielectric is not limited to silicon based substrates, but may be used with a variety of semiconductor substrates.

Figure 7:
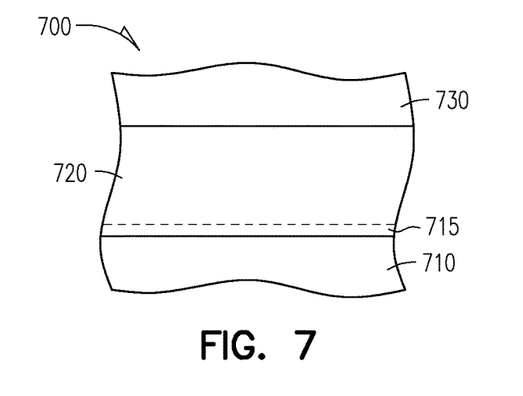
FIG. 7 shows an embodiment of a configuration of a capacitor with a dielectric having a graded dielectric layer.

Embodiments of methods for forming graded dielectric layers may also be applied to forming capacitors in various integrated circuits, memory devices, and electronic systems. In an embodiment, a capacitor 700, illustrated in FIG. 7, includes a first conductive layer 710, a dielectric layer 720 containing a graded dielectric disposed on first conductive layer 710, and a second conductive layer 730 disposed on dielectric layer 720. Dielectric layer 720 may include one or more insulating layers in which at least one layer is a graded dielectric layer. In an embodiment, dielectric layer 720 includes a graded dielectric layer having an amorphous layer in contact with second conductive layer 730. Dielectric layer 720 may be formed by atomic layer deposition or other appropriate technique to form the graded dielectric layer in accordance with embodiments herein. An interfacial layer 715 may form between first conductive layer 710 and dielectric layer 720. In an embodiment, interfacial layer 715 may be limited to a relatively small thickness compared to dielectric layer 720, or to a thickness significantly less than dielectric layer 720 as to be effectively eliminated. Embodiments for dielectric layer 720 including a graded dielectric layer in a capacitor includes, but is not limited to, dielectrics in DRAM capacitors and dielectrics in capacitors in analog, radio frequency (RF), and mixed signal integrated circuits.

Various embodiments for a graded dielectric film may provide for enhanced device performance by providing devices with reduced leakage current. Additional improvements in leakage current characteristics may be attained by forming one or more layers of a graded dielectric layer in a nanolaminate structure with metal oxides, with non-metal containing dielectrics, or with metal oxides and with non-metal containing dielectrics. The transition from one layer of the nanolaminate to another layer of the nanolaminate provides further disruption to a tendency for an ordered structure in the nanolaminate stack.

Figure 8:
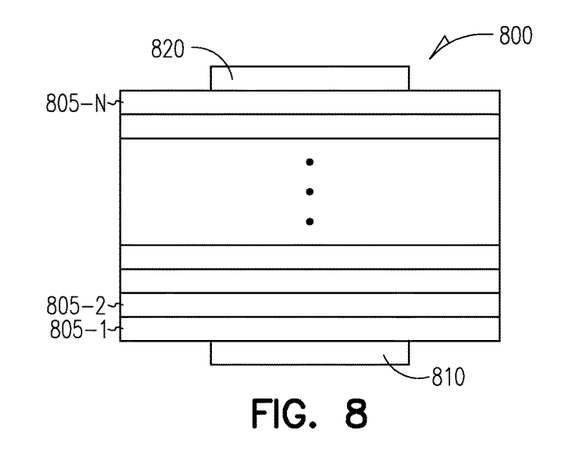
FIG. 8 depicts an embodiment of a nanolaminate having at least one graded dielectric layer.

FIG. 8 depicts a nanolaminate structure 800 for an embodiment of a dielectric structure including a graded dielectric layer. Nanolaminate structure 800 includes a plurality of layers 805-1, 805-2 to 805-N, where at least one layer contains a graded dielectric layer. In an embodiment, nanolaminate structure 800 is formed by atomic layer deposition. The effective dielectric constant associated with nanolaminate structure 800 is that attributable to N capacitors in series, where each capacitor has a thickness defined by the thickness of the corresponding layer. By selecting each thickness and the composition of each layer, a nanolaminate structure can be engineered to have a predetermined dielectric constant. In an embodiment, nanolaminate structure 800 has conductive contacts 810 and 820 to provide electrical conductivity to the electronic device structure in which it is formed. Embodiments for structures such as nanolaminate structure 800 may be used as nanolaminate dielectrics in NROM flash memory devices as well as other integrated circuits.

Transistors, capacitors, and other devices having graded dielectric films formed by the methods described above may be implemented into memory devices and electronic systems including information handling devices. Embodiments of these information handling devices may include telecommunication systems, wireless systems, and computers. Further, embodiments of electronic devices having graded dielectric films may be realized as integrated circuits.

Figure 9:
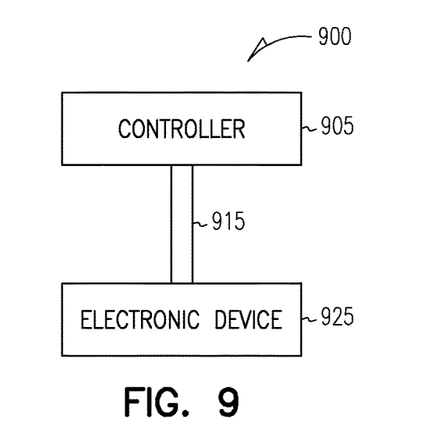
FIG. 9 is a simplified diagram for an embodiment of a controller coupled to an electronic device, where the controller, electronic device, or the controller and the electronic device have a graded dielectric layer.

FIG. 9 illustrates a diagram for an electronic system 900 having one or more devices having a graded dielectric layer in accordance with various embodiments. Electronic system 900 includes a controller 905, a bus 915, and an electronic device 925, where bus 915 provides electrical conductivity between controller 905 and electronic device 925. In various embodiments, controller 905, electronic device 925, or controller 905 and electronic device 925 include an embodiment for a graded dielectric layer. Electronic system 900 may include, but is not limited to, information handling devices, wireless systems, telecommunication systems, fiber optic systems, electro-optic systems, and computers.

Figure 10:
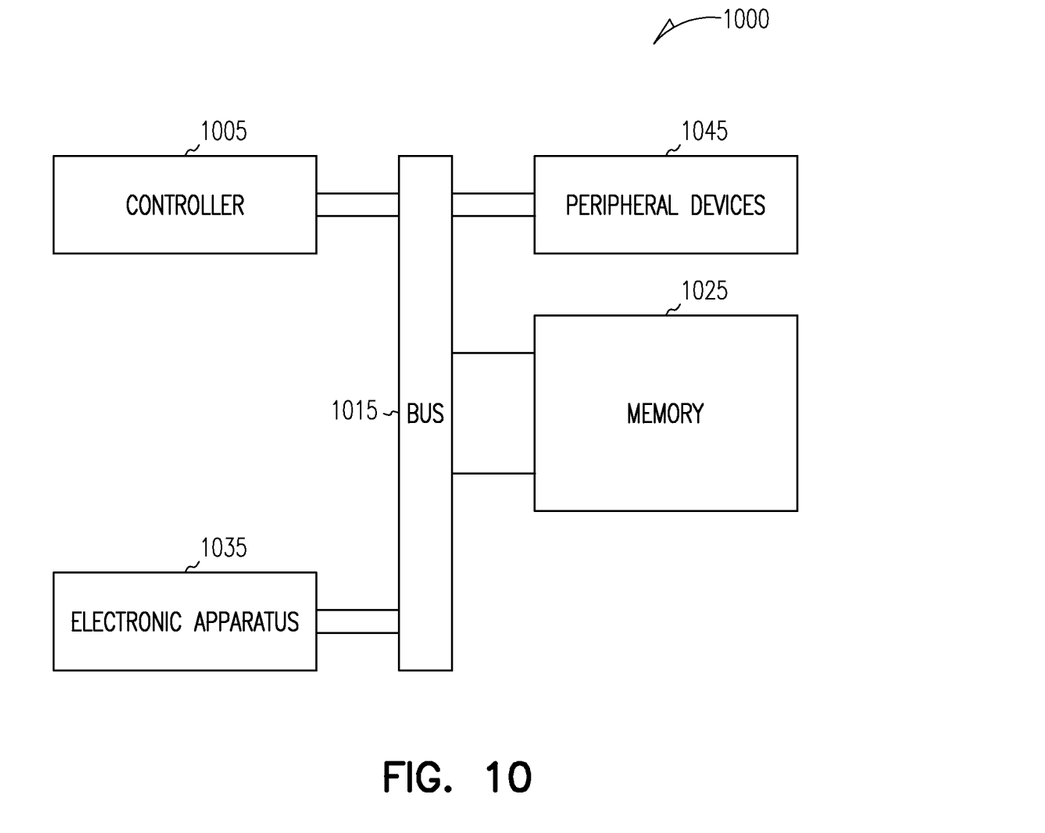
FIG. 10 illustrates a diagram for an embodiment of an electronic system having one or more devices having a graded dielectric layer.

FIG. 10 depicts a diagram of an embodiment of a system 1000 having a controller 1005 and a memory 1025. Controller 1005, memory 1025, or controller 1005 and memory 1025 may include an embodiment of a graded dielectric layer in accordance with the teachings herein. System 1000 also includes an electronic apparatus 1035 and a bus 1015, where bus 1015 provides electrical conductivity between controller 1005 and electronic apparatus 1035, and between controller 1005 and memory 1025. Bus 1015 may include an address, a data bus, and a control bus, each independently configured. Alternatively, bus 1015 may use common conductive lines for providing address, data, or control, the use of which is regulated by controller 1005. Alternatively, bus 1015 may use common conductive lines for providing address, data, and control, the use of which is regulated by controller 1005. In an embodiment, electronic apparatus 1035 may be additional memory configured similar as memory 1025. An embodiment may include an additional peripheral device or devices 1045 coupled to bus 1015. In an embodiment, controller 1005 is a processor. In an embodiment, controller 1005 is a processor having a memory. Any of controller 1005, memory 1025, bus 1015, electronic apparatus 1035, and peripheral device devices 1045 may include a graded dielectric layer. System 1000 may include, but is not limited to, information handling devices, telecommunication systems, and computers.

Peripheral devices 1045 may include displays, additional storage memory, or other control devices that may operate in conjunction with controller 1005. Alternatively, peripheral devices 1045 may include displays, additional storage memory, or other control devices that may operate in conjunction with controller 1005, memory 1025, or controller 1005 and memory 1025.

Memory 1025 may be realized as a memory device containing a graded dielectric layer in accordance with various embodiments. It will be understood that embodiments are equally applicable to any size and type of memory circuit and are not intended to be limited to a particular type of memory device. Memory types include a DRAM, SRAM (Static Random Access Memory) or Flash memories. Additionally, the DRAM could be a synchronous DRAM commonly referred to as SGRAM (Synchronous Graphics Random Access Memory), SDRAM (Synchronous Dynamic Random Access Memory), SDRAM II, and DDR SDRAM (Double Data Rate SDRAM), as well as Synchlink or Rambus DRAMs and other emerging DRAM technologies.

Although specific embodiments have been illustrated and described herein, it will be appreciated by those of ordinary skill in the art that any arrangement that is calculated to achieve the same purpose may be substituted for the specific embodiments shown. This application is intended to cover any adaptations or variations of embodiments of the present invention. It is to be understood that the above description is intended to be illustrative, and not restrictive, and that the phraseology or terminology employed herein is for the purpose of description and not of limitation. Combinations of the above embodiments and other embodiments will be apparent to those of skill in the art upon studying the above description. The scope of the present invention includes any other applications in which embodiment of the above structures and fabrication methods are used. The scope of the embodiments of the present invention should be determined with reference to the appended claims, along with the full scope of equivalents to which such claims are entitled.

What is claimed is:
1. A device comprising:
a metal oxide doped with a dopant, the metal oxide having a top surface and a bottom surface, wherein the metal oxide has varying amounts of the dopant across the metal oxide between the top and bottom surfaces with concentrations of the dopant at the top surface and at the bottom surface each being greater than a concentration of the dopant in a center of the metal oxide between the top surface and the bottom surface, the dopant including a metal dopant and/or silicon.

2. The device of claim 1, wherein the metal oxide comprises monolayers across the metal oxide.

3. The device of claim 1, wherein the dopant includes a metal dopant.

4. The device of claim 1, further comprising first and second electrodes;
wherein the top and bottom surfaces are in contact with the first and second electrodes, respectively.

5. The device of claim 3, wherein the dopant concentration at the center of the metal oxide is less than a concentration of the metal dopant in any other part of the metal oxide.

6. The device of claim 1, wherein the metal oxide includes a binary metal oxide.

7. The device of claim 6, wherein the metal oxide includes any one of Lanthanide oxides, HfO2, ZrO2 and TiO2.

8. The device of claim 3, wherein the metal dopant includes more than one type of metal dopant.

9. The device of claim 4, wherein the metal oxide between the first and second electrodes is a dielectric layer of a capacitor.

10. A device comprising:
a metal oxide doped with a dopant, the metal oxide having a top surface and a bottom surface, wherein the metal oxide has varying amounts of the dopant across the metal oxide between the top and bottom surfaces with concentrations of the dopant at the top surface and at the bottom surface each being greater than a concentration of the dopant in a center of the metal oxide between the top surface and the bottom surface, wherein the center of the metal oxide includes a crystalline layer, and each of the first and second interfaces includes an amorphous layer.

11. A device comprising a capacitor, the capacitor including a dielectric layer between first and second electrodes, the dielectric layer including a metal oxide doped with a dopant, the metal oxide comprising:
a first interface region on a side of the first electrode, the first interface region having a first concentration of the dopant;
a second interface region on a side of the second electrode, the second interface region having a second concentration of the dopant; and
a intermediate region between the first and second interface regions, the intermediate region having a third concentration of the dopant, the third concentration being lower than each of the first and second concentrations, wherein the dopant includes a metal dopant and/or silicon.

12. The device of claim 11, wherein the metal oxide comprises monolayers across the metal oxide.

13. The device of claim 11, wherein the metal oxide includes a binary metal oxide.

14. The device of claim 13, wherein the metal oxide includes any one of Lanthanide oxides, HfO2, ZrO2 and TiO2.

15. The device of claim 11, wherein the dopant includes a metal dopant.

16. The device of claim 15, wherein the metal dopant includes more than one type of metal dopant.

17. A device comprising a capacitor, the capacitor including a dielectric layer between first and second electrodes, the dielectric layer including a metal oxide doped with a dopant, the metal oxide comprising:
a first interface region on a side of the first electrode, the first interface region having a first concentration of the dopant;
a second interface region on a side of the second electrode, the second interface region having a second concentration of the dopant; and
a intermediate region between the first and second interface regions, the intermediate region having a third concentration of the dopant, the third concentration being lower than each of the first and second concentrations, wherein the intermediate region of the metal oxide includes a crystalline layer, and each of the first and second interface regions includes an amorphous layer.

18. A device comprising a transistor, the transistor including a gate dielectric film having a first interface toward a gate electrode and a second interface toward a channel region, the gate dielectric film including a metal oxide doped with a dopant, wherein each of the first and second interfaces is larger in a concentration of the dopant than a center of the metal oxide between the first and second interfaces, the dopant including a metal dopant and/or silicon.

19. The device of claim 18, wherein the metal oxide includes a binary metal oxide.

20. The device of claim 18, wherein the dopant includes a metal dopant.

* * * * *